(12) United States Patent
Liu et al.

(10) Patent No.: US 11,569,311 B2
(45) Date of Patent: Jan. 31, 2023

(54) ARRAY SUBSTRATE WITH SUB-PIXELS INCLUDING POWER-SUPPLYING WIRE PORTIONS HAVING OPENINGS THEREBETWEEN AND MANUFACTURING METHOD THEREOF, AND DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tingliang Liu, Beijing (CN); Zhen Zhang, Beijing (CN); Ke Dai, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 98 days.

(21) Appl. No.: 16/908,878

(22) Filed: Jun. 23, 2020

(65) Prior Publication Data

US 2020/0411611 A1 Dec. 31, 2020

(30) Foreign Application Priority Data

Jun. 27, 2019 (CN) .......................... 201910567288.3

(51) Int. Cl.
*H01L 27/32* (2006.01)
*H01L 51/56* (2006.01)
*G06V 40/13* (2022.01)

(52) U.S. Cl.
CPC .......... *H01L 27/3234* (2013.01); *G06V 40/13* (2022.01); *H01L 27/3276* (2013.01); *H01L 51/56* (2013.01); *H01L 2227/323* (2013.01)

(58) Field of Classification Search
CPC ............ H01L 27/3234; H01L 27/3276; H01L 27/3225; H01L 27/3227; H01L 2227/323; H01L 51/56
USPC ........................................................ 257/71
See application file for complete search history.

(56) References Cited

U.S. PATENT DOCUMENTS 10,510,814 B2  12/2019  Sun et al.
10,719,686 B2  7/2020   Ma et al.
(Continued)

FOREIGN PATENT DOCUMENTS

CN  107946337 A  4/2018
CN  108269503 A  7/2018
(Continued)

OTHER PUBLICATIONS

First Chinese Office Action from Chinese Patent Application No. 201910567288.3 dated Feb. 3, 2021.

*Primary Examiner* — Matthew E. Gordon
(74) *Attorney, Agent, or Firm* — Dilworth & Barrese, LLP; Michael J. Musella, Esq.

(57) ABSTRACT

An array substrate, a manufacturing method thereof and a display panel are provided. The array substrate includes sub-pixel units, and each sub-pixel unit includes a light emitting region and a non-light emitting region; each sub-pixel unit includes a light emitting element, the light emitting element includes a light emitting layer and a first electrode, and at least a part of the first electrode is in the light emitting region. A plurality of first wires are configured to supply a power signal to the light emitting element and include a first sub-wire; the first sub-wire includes a plurality (Continued)

of portions, adjacent two of the plurality of portions are spaced apart from each other by an opening in the light emitting region; at least a part of an orthographic projection of the opening on the array substrate does not overlap with an orthographic projection of the first electrode on the array substrate.

19 Claims, 17 Drawing Sheets

(56) References Cited

U.S. PATENT DOCUMENTS

| | | | |
|---|---|---|---|
| 10,733,412 B2 | 8/2020 | Cui et al. | |
| 10,810,397 B2 | 10/2020 | Zeng et al. | |
| 2018/0219058 A1* | 8/2018 | Xiang | H01L 27/3225 |
| 2019/0237491 A1 | 8/2019 | Chen et al. | |
| 2019/0325190 A1* | 10/2019 | Cui | G06V 40/13 |
| 2019/0392190 A1 | 12/2019 | Chen et al. | |
| 2020/0294446 A1 | 9/2020 | Long et al. | |
| 2020/0403055 A1* | 12/2020 | Jung | H01L 27/3276 |
| 2022/0020321 A1* | 1/2022 | Jung | G09G 5/377 |

FOREIGN PATENT DOCUMENTS

| | | | | |
|---|---|---|---|---|
| CN | 108615008 A | | 10/2018 | |
| CN | 108805055 A | | 11/2018 | |
| CN | 108878488 A | | 11/2018 | |
| CN | 108899339 A | * | 11/2018 | G06K 9/0004 |
| CN | 108899339 A | | 11/2018 | |
| CN | 208753327 A | | 4/2019 | |
| WO | 2018113207 A1 | | 6/2018 | |

\* cited by examiner

A-A' ively connected to one second sub-wire, which is
ARRAY SUBSTRATE WITH SUB-PIXELS INCLUDING POWER-SUPPLYING WIRE PORTIONS HAVING OPENINGS THEREBETWEEN AND MANUFACTURING METHOD THEREOF, AND DISPLAY PANEL The application claims priority to the Chinese patent application No. 201910567288.3, filed on Jun. 27, 2019, the entire disclosure of which is incorporated herein by reference as part of the present application.

TECHNICAL FIELD

At least one embodiment of the present disclosure relates to an array substrate, a manufacturing method of the array substrate, and a display panel.

BACKGROUND

At present, solutions of key virtualization, under-screen fingerprint recognition, under-screen sounder and the like are applied in OLED display products. In these solutions, a function region outside a display region is reduced, and a part of the function region is provided to the back side of the display region, which requires the cooperation of under-screen chips. Therefore, the transmittance of the display region is affected by the under-screen chips. In this case, it is of great significance to improve the transmittance of the display region.

SUMMARY

At least one embodiment of the present disclosure provides an array substrate, and the array substrate comprises: a plurality of pixel units in an array, a light emitting element and a plurality of first wires. Each of the plurality of pixel units comprises a plurality of sub-pixel units, and each of the plurality of sub-pixel units comprises a light emitting region and a non-light emitting region; each of the plurality of sub-pixel units comprises the light emitting element, the light emitting element comprises a light emitting layer and a first electrode electrically connected to the light emitting layer, and at least a part of the first electrode is in the light emitting region; and the plurality of first wires are configured to supply a power signal to the light emitting element and comprise a first sub-wire; the first sub-wire extends in a first direction and comprises a plurality of portions, the plurality of portions are arranged in the first direction and adjacent two portions of the plurality of portions are spaced apart from each other by an opening, and the opening is in the light emitting region; the first electrode of the light emitting element is stacked with the plurality of first wires in a direction perpendicular to the array substrate, and at least a part of an orthographic projection of the on the array substrate does not overlap with an orthographic projection of the first electrode on the array substrate.

For example, the array substrate provided by at least one embodiment of the present disclosure further comprises a plurality of auxiliary wires extending along a second direction intersecting the first direction; the plurality of first wires further comprise a second sub-wire continuously extending along the first direction; the plurality of portions of the first sub-wire are respectively electrically connected to the second sub-wire through the plurality of auxiliary wires.

For example, in the array substrate provided by at least one embodiment of the present disclosure, the plurality of first wires comprise a plurality of the second sub-wires, and at least one of the plurality of portions of the first sub-wire is electrically connected to one second sub-wire, which is closest to the at least one of the plurality of portions, of the plurality of second sub-wires through at least one of the plurality of auxiliary wires.

For example, in the array substrate provided by at least one embodiment of the present disclosure, at least one of the plurality of portions of the first sub-wire is electrically connected to the second sub-wire through at least two auxiliary wires of the plurality of auxiliary wires.

For example, in the array substrate provided by at least one embodiment of the present disclosure, the plurality of auxiliary wires have first intersections points respectively with the plurality of portions of the first sub-wire, and the plurality of auxiliary wires are respectively electrically connected to the plurality of portions of the first sub-wire at the first intersections points; the plurality of auxiliary wires respectively have second intersection points with the second sub-wire, and the plurality of auxiliary wires are respectively electrically connected to the second sub-wire at the second intersection points.

For example, the array substrate provided by at least one embodiment of the present disclosure further comprises an insulation layer, and the insulation layer is between the plurality of first wires and the plurality of auxiliary wires and comprises a plurality of first via holes, wherein a part of the plurality of first via holes are at the first intersection points, and the plurality of auxiliary wires are respectively electrically connected to the plurality of portions of the first sub-wire through the part of the plurality of first via holes; another part of the plurality of first via holes are at the second intersection points, and the plurality of auxiliary wires are respectively electrically connected to the second sub-wire through the another part of the first via holes.

For example, in the array substrate provided by at least one embodiment of the present disclosure, areas of the first electrodes of the plurality of sub-pixel units in each of the plurality of pixel units are different, the plurality of sub-pixel units in each of the plurality of pixel units comprise a first sub-pixel unit, and an area of the first electrode of the first sub-pixel unit is smallest among the first electrodes of the plurality of sub-pixel units in each of the plurality of pixel units; the opening is not in the light emitting region of the first sub-pixel unit, and the opening is in the light emitting regions of other sub-pixel units except the first sub-pixel unit.

For example, in the array substrate provided by at least one embodiment of the present disclosure, each of the plurality of pixel units comprises a red sub-pixel unit emitting red light, a green sub-pixel unit emitting green light, and a blue sub-pixel unit emitting blue light; the opening is in the light emitting region of the blue sub-pixel unit and in the light emitting region of the red sub-pixel unit, and the is not in the light emitting region of the green sub-pixel unit.

For example, in the array substrate provided by at least one embodiment of the present disclosure, the first electrode of the light emitting element is an anode, and the plurality of first wires and the first electrode of the light emitting element all are opaque.

For example, in the array substrate provided by at least one embodiment of the present disclosure, a material of the plurality of first wires and a material of the first electrode of the light emitting element both are a metal material.

For example, the array substrate provided by at least one embodiment of the present disclosure further comprises a data line, and the data line is configured to provide a data signal for controlling a light emitting state of the light emitting layer to the light emitting element if the power signal is applied to the light emitting element, wherein the data line is in a same layer as the first wires and comprises a same material as the first wires.

For example, the array substrate provided by at least one embodiment of the present disclosure further comprises a pixel circuit, and the pixel circuit comprises: a transistor and a storage capacitor; the transistor comprises an active layer, a gate electrode, a source electrode and a drain electrode; the storage capacitor comprises a first electrode plate and a second electrode plate which are opposite to each other. The gate electrode of the transistor is in a same layer as the first electrode plate of the storage capacitor and comprises a same material as the first electrode plate of the storage capacitor, and the plurality of auxiliary wires are in a same layer as the second electrode plate of the storage capacitor and comprise a same material as the second electrode plate of the storage capacitor.

At least one embodiment of the present disclosure further provides a display panel, and the display panel comprises any one of the array substrates provided by the embodiments of the present disclosure.

For example, the display panel provided by at least one embodiment of the present disclosure further comprises a fingerprint recognition device and a fingerprint recognition region. The fingerprint recognition device is provided on the array substrate and in the fingerprint recognition region; and at least a part of the orthographic projection of the opening on the array substrate is in the fingerprint recognition region.

For example, the display panel provided by at least one embodiment of the present disclosure further comprises a non-fingerprint recognition region except the fingerprint recognition region; no part of the orthographic projection of the opening on the array substrate is in the non-fingerprint recognition region.

At least one embodiment of the present disclosure further provides a display apparatus, and the display apparatus comprises any one of the display panels provided by the embodiments of the disclosure.

At least one embodiment of the present disclosure further provides a manufacturing method of an array substrate, and the array substrate comprises a plurality of pixel units in an array, each of the plurality of pixel units comprises a plurality of sub-pixel units, and each of the plurality of sub-pixel units comprises a light emitting region and a non-light emitting region; the manufacturing method comprises: forming a light emitting element in each of the plurality of sub-pixel units, in which the light emitting element comprises a light emitting layer and a first electrode electrically connected to the light emitting layer, and at least a part of the first electrode is in the light emitting region; and forming a plurality of first wires, in which the plurality of first wires are configured to supply a power signal to the light emitting element, and the plurality of first wires comprise a first sub-wire; the first sub-wire extends along a first direction and comprises a plurality of portions, the plurality of portions are arranged in the first direction and adjacent two portions of the plurality of portions are spaced apart from each other by an opening, and the opening is in the light emitting region; and the first electrode of the light emitting element is stacked with the plurality of first wires in a direction perpendicular to the array substrate, and at least a part of an orthographic projection of the opening on the array substrate does not overlap with an orthographic projection of the first electrode on the array substrate.

For example, the manufacturing method provided by at least one embodiment of the present disclosure further comprises: forming a plurality of auxiliary wires, in which the plurality of auxiliary wires extend along a second direction intersecting the first direction; the forming the plurality of first wires further comprise: forming a second sub-wire, in which the second sub-wire continuously extends along the first direction, and the plurality of portions of the first sub-wire are respectively electrically connected to the second sub-wire through the plurality of auxiliary wires.

For example, the manufacturing method provided by at least one embodiment of the present disclosure further comprises: forming a transistor and a storage capacitor; the forming the transistor and the storage capacitor comprises: forming a gate metal layer; and performing one patterning process on the gate metal layer to form a gate electrode of the transistor and a first electrode plate of the storage capacitor.

For example, the manufacturing method provided by at least one embodiment of the present disclosure further comprises: forming a first metal layer; and performing one patterning process on the first metal layer to form the plurality of auxiliary wires and a second electrode plate of the storage capacitor, in which the second electrode plate of the storage capacitor and at least one auxiliary wire of the auxiliary wires are integral with each other.

For example, in the manufacturing method provided by at least one embodiment of the present disclosure, the array substrate comprises a data line, the data line is configured to provide a data signal for controlling a light emitting state of the light emitting layer to the light emitting element if the power signal is applied to the light emitting element, and the manufacturing method comprises: forming a second metal layer; and performing one patterning process on the second metal layer to form the data line and the plurality of first wires.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
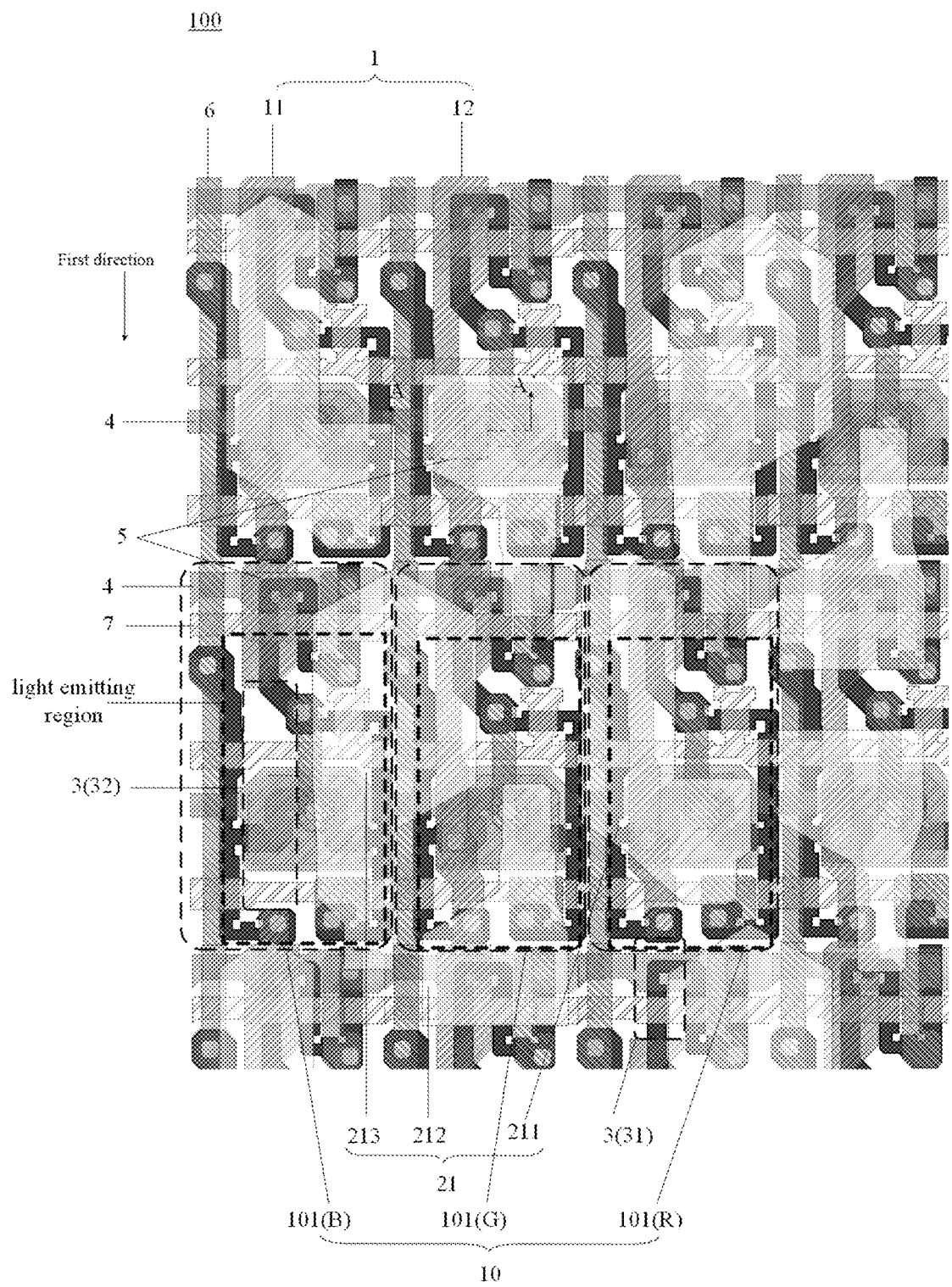
FIG. 1A is a schematic plan view of an array substrate provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "In," "out," "on," "under" and the like are only used to indicate relative position relationship, and when the position of the object which is described is changed, the relative position relationship may be changed accordingly.

The figures in embodiments of the present disclosure are not drawn according to actual proportions or scales. The total number of pixel units of the array substrate is not limited to the case illustrated in the figures, the specific size of each structure may be determined according to actual acquirements. The figures of the embodiments of the present disclosure are only schematic views.

At least one embodiment of the present disclosure provides an array substrate, and the array substrate comprises: a plurality of pixel units in an array, a light emitting element and a plurality of first wires. Each of the plurality of pixel units comprises a plurality of sub-pixel units, and each of the plurality of sub-pixel units comprises a light emitting region and a non-light emitting region; each of the plurality of sub-pixel units comprises the light emitting element, the light emitting element comprises a light emitting layer and a first electrode electrically connected to the light emitting layer, and at least a part of the first electrode is in the light emitting region; and the plurality of first wires are configured to supply a power signal to the light emitting element and comprise a first sub-wire; the first sub-wire extends in a first direction and comprises a plurality of portions, the plurality of portions are arranged in the first direction and adjacent two portions of the plurality of portions are spaced apart from each other by an opening, and the opening is in the light emitting region; the first electrode of the light emitting element is stacked with the plurality of first wires in a direction perpendicular to the array substrate, and at least a part of an orthographic projection of the at least one opening on the array substrate does not overlap with an orthographic projection of the first electrode on the array substrate.

Figure 1B:
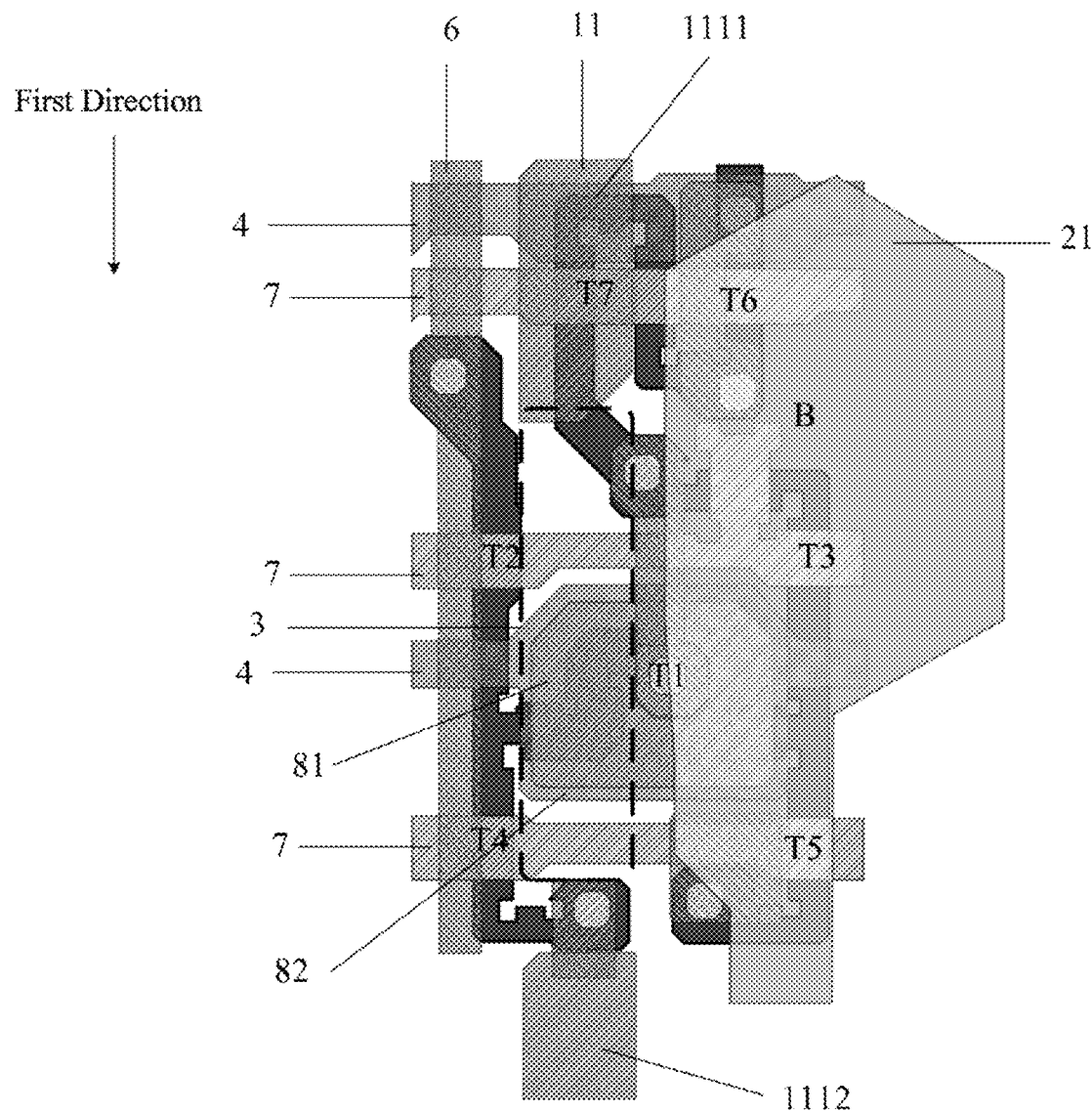
FIG. 1B is a schematic plan view of one sub-pixel unit in FIG. 1A.

Illustratively, FIG. 1A is a schematic plan view of the array substrate provided by the embodiments of the present disclosure, FIG. 1B is a schematic plan view of one sub-pixel unit in FIG. 1A. As illustrated in FIG. 1A and FIG. 1B, an array substrate 100 includes a plurality of pixel units 10 arranged in an array, a light emitting element (not illustrated) and a plurality of first wires 1. Each of the plurality of pixel units 10 includes a plurality of sub-pixel units 101, and each of the plurality of sub-pixel units 101 includes a light emitting region and a non-light emitting region. For example, the sub-pixel unit is the smallest unit that emit light for a purpose of displaying an image, and each sub-pixel unit includes the light emitting element. For example, the light emitting element is in the light emitting region, the light emitting region emits light, and the non-light emitting region surrounds the light emitting region. One part (some first wires 1) of the plurality of first wires 1 are in the light emitting region and the other part (other first wires 1) of the plurality of first wires 1 are in the non-light emitting region. The light emitting element includes a light emitting layer and a first electrode 21 electrically connected to the light emitting layer, at least a part of the first electrode 21 is in the light emitting region. The plurality of first wires 1 are configured to supply a power signal to the light emitting element, such as a high voltage power signal (VDD signal), a low voltage power signal (VSS signal), or a current power signal. And, as illustrated in FIG. 1A, the plurality of first wires 1 include a first sub-wire 11 that extends in a first direction, each first sub-wire 11 includes a plurality of portions that are arranged in the first direction, two adjacent portions 1111 and 1112 of the plurality of portions of each first sub-wire 11 are spaced apart from each other by an opening 3, i.e., the first sub-wire 11 is broken at the opening 3, and the opening 3 is in the light emitting region. The first electrode 21 of the light emitting element is stacked with the plurality of first wires 1 in a direction perpendicular to the array substrate 100, and the opening 3 does not overlap with the first electrode 21 in the direction perpendicular to the array substrate 100. That is, an orthographic projection of the opening 3 on the array substrate 100 does not overlap with an orthographic projection of the first electrode 21 on the array substrate 100, or is spaced apart from the orthographic projection of the first electrode 21 on the array substrate 100. Thus, the opening 3 does not coincide with the first electrode 21 to increase the light transmittance of the pixel structure including the opening. For example, the first electrode 21 of the light emitting element is an anode. For example, the first wires 1 and the first electrode 21 of the light emitting element all are opaque. In this case, a light transmission area of the pixel structure is increased, so that the aperture ratio of the pixel structure is improved.

For example, in FIG. 1B, the entire opening 3 does not overlap with the first electrode 21 in the direction perpendicular to the array substrate 100. For example, in other sub-pixel units, a part of the opening 3 does not overlap with the first electrode 21 in the direction perpendicular to the array substrate 100. For example, the array substrate 100 further includes a base substrate, the plurality of pixel units 10, the light emitting element and the plurality of first wires 1 are all disposed on the base substrate, and at least a part of the opening 3 does not overlap with the first electrode 21 in the direction perpendicular to the base substrate, that is, an orthographic projection of the opening 3 on the base substrate at least partially does not overlap with an orthographic projection of the first electrode 21 on the base substrate. For example, in FIG. 1B, the orthographic projection of the entire opening 3 on the base substrate does not overlap with the orthographic projection of the first electrode 21 on the base substrate. In other sub-pixel units, for example, a part of the orthographic projection of the opening 3 on the base substrate does not overlap with the orthographic projection of the first electrode 21 on the base substrate.

For example, as illustrated in FIG. 1A, the array substrate includes a plurality of first electrodes 21 which are in one-to-one correspondence with the plurality of sub-pixel units. In the array substrate 100, the total number of the openings 3 in one sub-pixel unit is one or more, and for example, a part (some sub-pixel units) of the plurality of sub-pixel units are not provided with the opening 3; that is, the total number of the opening 3 corresponding to each of some sub-pixel units is one or more, while each of some other sub-pixel units is not provided with the opening 3. Therefore, one first electrode 21 correspond to one or more of the openings 3, while another first electrode 21 does not correspond to the opening 3.

It should be noted that FIG. 1A is only a partial schematic diagram of the array substrate provided by the embodiments of the present disclosure. For example, positions of the openings 3 are different for different first sub-wires 11; for example, referring to FIG. 1A and FIG. 3, one first sub-wire 11 has the opening 31, and another first sub-wire 11 has the opening 32, the position of the opening 31 in the one first sub-wire 11 does not correspond to the position of the opening 32 in the another sub-wire 11.

It should be noted that in FIG. 1B, only one opening is illustrated for one first sub-wire 11. However, the embodiments of the present disclosure are not limited to this case, and one first sub-wire 11 for example is divided into a plurality of portions spaced apart from each other by a plurality of openings; for example, referring to FIG. 3, the first sub-wire 11 is divided into three portions by the two openings 32 and 33.

Figure 2:
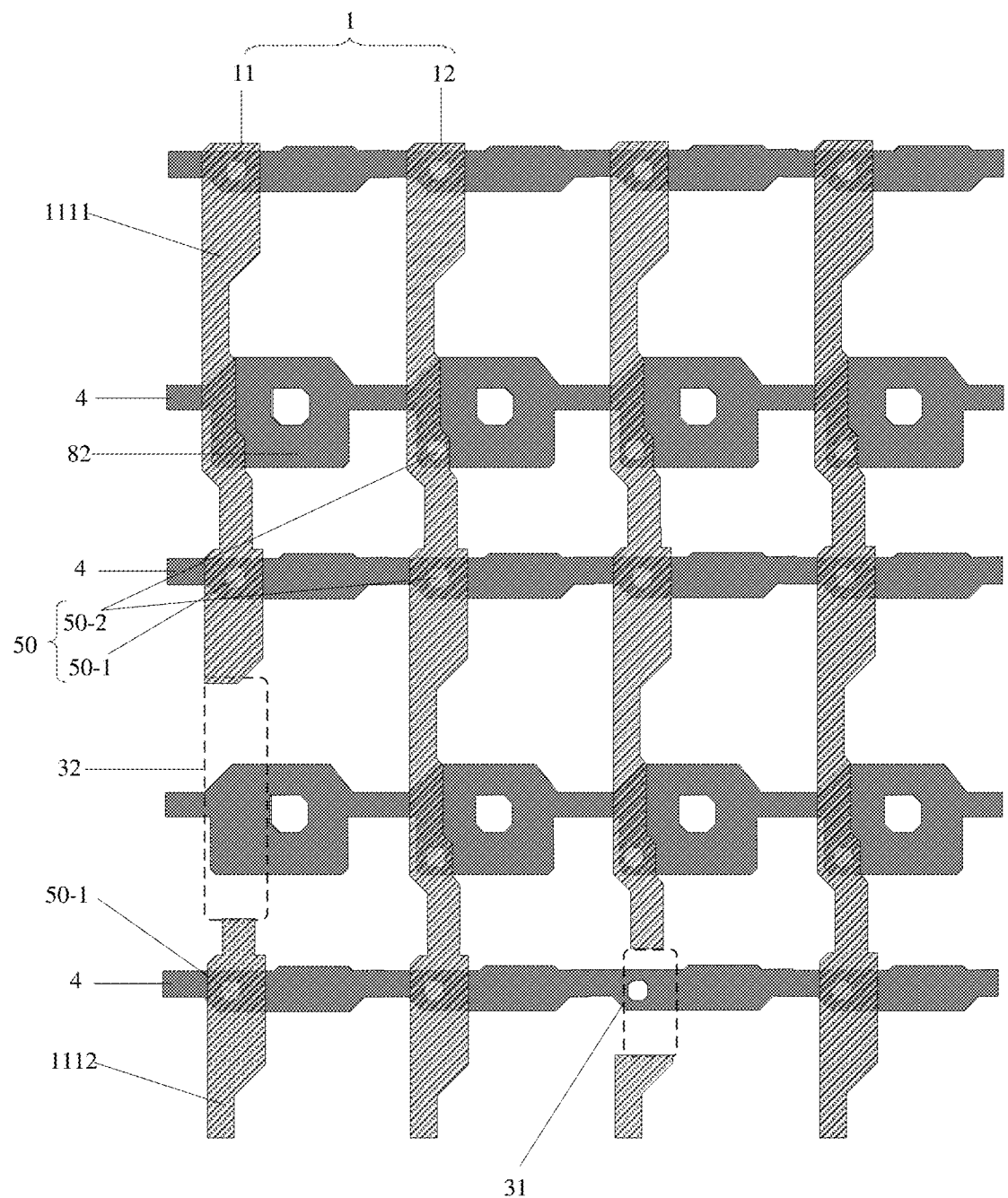
FIG. 2 is a schematic plan view of first wires and auxiliary wires of the array substrate illustrated in FIG. 1A.

For example, the array substrate 100 further includes a plurality of auxiliary wires 4 extending in a second direction intersecting the first direction. FIG. 2 is a schematic plan view of the first wires and the auxiliary wires of the array substrate illustrated in FIG. 1A. As illustrated in FIG. 1A and FIG. 2, the plurality of first wires 1 further include a second sub-wire 12 that extends continuously in the first direction, i.e., the second sub-wire 12 does not include a plurality of portions spaced apart from each other by the openings and the second sub-wire 12 is not broken by the openings. The plurality of portions of the first sub-wire 11 are respectively electrically connected to the second sub-wire 12 through the plurality of auxiliary wires 4. The connection relationship of the auxiliary wires 4 and the first wires 1 as described above can transmit the power signal on the first wires 1 to each of the plurality of sub-pixel units, thereby providing the power signal to each of the plurality of sub-pixel units. For example, the sub-pixel units include a plurality of rows and a plurality of columns, the plurality of first wires 1 are in one-to-one correspondence with the plurality of columns of the sub-pixel units, and the plurality of auxiliary wires 4 are in one-to-one correspondence with the plurality of rows of the sub-pixel units.

Figure 3:
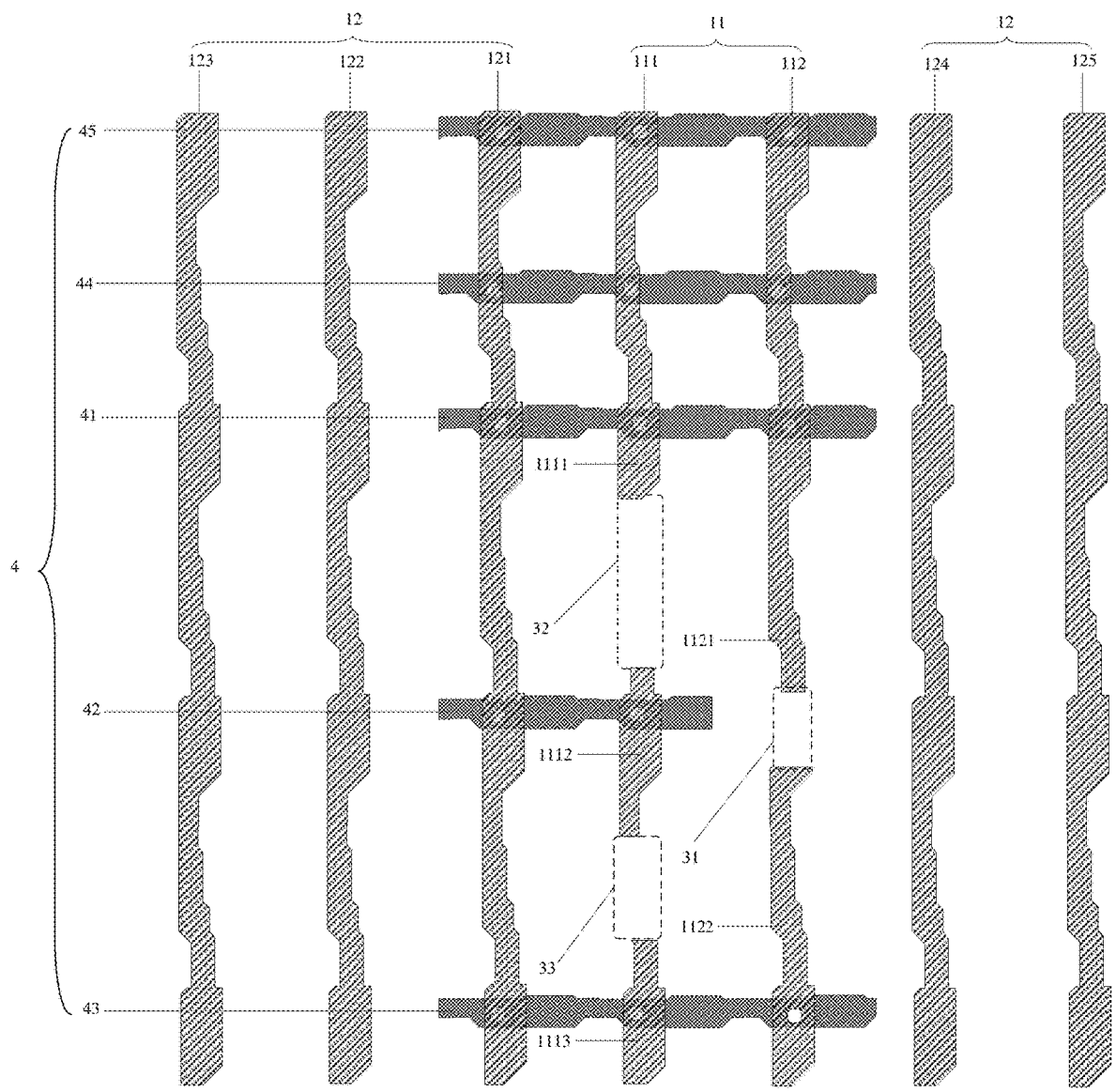
FIG. 3 is another schematic diagram of the first wires and the auxiliary wires of the array substrate illustrated in FIG. 1A.

For example, in at least one embodiment of the present disclosure, the plurality of first wires include a plurality of the second sub-wires, and at least one of the plurality of portions of the first sub-wire is electrically connected to one second sub-wire, which is closest to the at least one of the plurality of portions, among the plurality of second sub-wires through at least one of the plurality of auxiliary wires. FIG. 3 is a schematic diagram of the first wires and the auxiliary wires provided by the embodiments of the present disclosure. As illustrated in FIG. 3, the first wires 1 include the first sub-wires 111 and 112, the second sub-wires 121, 122, 123, 124 and 125; the auxiliary wires 4 include the auxiliary wires 41, 42, 43, 44 and 45. The first sub-wire 111 includes a plurality of portions 1111, 1112, and 1113 that are spaced apart from each other by the openings 32 and 33, at least a part of the opening 32 and at least a part of the opening 33 respectively do not overlap with the first electrodes (not illustrated in FIG. 3) corresponding thereto in the direction perpendicular to the array substrate, i.e., at least a part of the orthographic projection of the opening 32 on the array substrate and at least a part of the orthographic projection of the opening 33 on the array substrate respectively do not overlap with the orthographic projections of the first electrodes (not illustrated in FIG. 3) corresponding thereto on the array substrate. The second sub-wire 121 is the second sub-wire closest to the first sub-wire 111 among the plurality of second sub-wires, and the portions 1111, 1112, and 1113 of the first sub-wire 111 are electrically connected to the second sub-wire 121 respectively through the auxiliary wires 41, 42, and 43. In this way, a length of the auxiliary wire 4 in the second direction is reduced, so that the resistance of the auxiliary wire 4 is reduced.

For example, in the structure illustrated in FIG. 3, because a left side of the first sub-wire 112 is provided with the first sub-wire 111, the auxiliary wires 41 and 43 connecting the first sub-wire 111 and the second sub-wire 121 are slightly extended to connect the first sub-wire 112 to the second sub-wire 121. Therefore, the plurality of portions 1121 and 1122 of the first sub-wire 112 that are spaced apart from each other by the opening 31 are respectively electrically connected to the second sub-wire 121 through the auxiliary wires 41 and 43. Of course, in other embodiments, in the case where the first sub-wire 112 is not adjacent to other first sub-wires, the plurality of portions 1121 and 1122 of the first sub-wire 112 are electrically connected to the second sub-wire 124, closest to the portions 1121 and 1122, among the plurality of second sub-wires through the auxiliary wires.

It should be noted that in the array substrate provided by the embodiments of the present disclosure, the total number of the openings corresponding to each first sub-wire is not limited and may be designed according to the arrangement of the first electrode and the required opening ratio.

For example, at least one of the portions of each first sub-wire is electrically connected to the second sub-wire through at least two auxiliary wires of the plurality of auxiliary wires. As illustrated in FIG. 3, the first portion 1111 of the first sub-wire 111 is electrically connected to the second sub-wire 121 through the three auxiliary wires 41, 44, and 45. Therefore, a plurality of parallel circuits are formed by the first sub-wire 111 and the plurality of auxiliary wires 41, 44 and 45, thereby reducing the resistance of signal transmission on the first portion 1111 of the first sub-wire 111 and improving the electrical efficiency.

For example, as illustrated in FIG. 3, the auxiliary wires 4 have first intersection points respectively with the plurality of first sub-wires 11, and the auxiliary wires 4 are electrically connected to the first sub-wires 11 at the first intersection points. The auxiliary wires 4 respectively have second intersection points with the second sub-wire 12, and the auxiliary wires 4 are electrically connected to the second sub-wire 12 at the second intersection points.

For example, each sub-pixel unit further includes a pixel circuit including a transistor, a storage capacitor and a signal line. For example, the transistor includes an active layer, a gate electrode, a source electrode, and a drain electrode. The storage capacitor includes a first electrode plate and a second electrode plate which are opposite to each other. The gate electrode of the transistor is in the same layer as the first electrode plate of the storage capacitor and comprises a same material as the first electrode plate of the storage capacitor, and the plurality of auxiliary wires are in the same layer as the second electrode plate of the storage capacitor and comprise a same material as the second electrode plate of the storage capacitor. For example, the second electrode plate of the storage capacitor and at least one auxiliary wire of the plurality of auxiliary wires are integral with each other.

Figure 4:
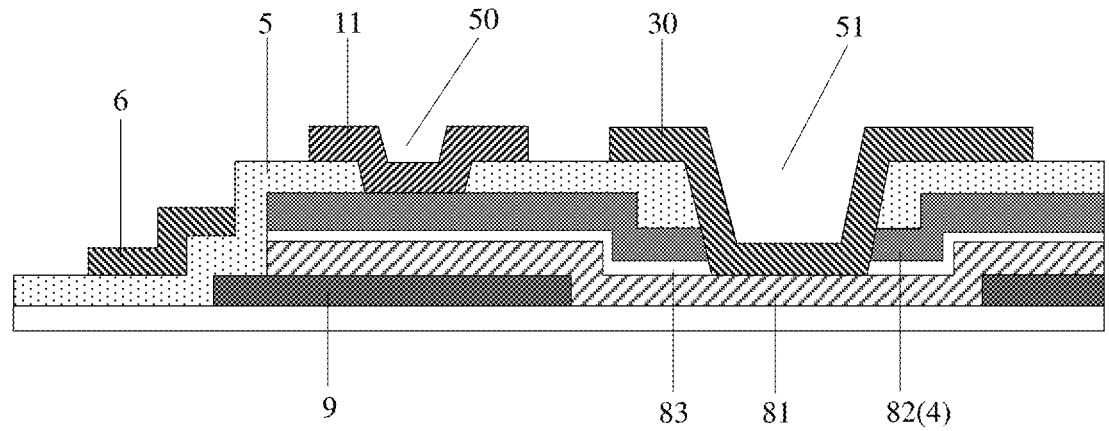
FIG. 4 is a sectional view taken along a wire A-A' in FIG. 1A.

FIG. 1C-FIG. 1F are schematic diagrams of each layer in FIG. 1B, and FIG. 4 is a sectional view taken along a wire A-A' in FIG. 1A. For example, an insulation layer is provided between adjacent layers illustrated in FIG. 1C-FIG. 1F. Referring to FIG. 1B-FIG. 1F, the array substrate includes an active layer 9, a gate line and a gate electrode 7 (the whole of the gate line and the gate electrode hereinafter is referred to as the gate electrode 7) that are integral with each other, a first electrode plate 81 and a second electrode plate 82 of the storage capacitor, a data line 6, and a data connection line 30.

Figure 1C:
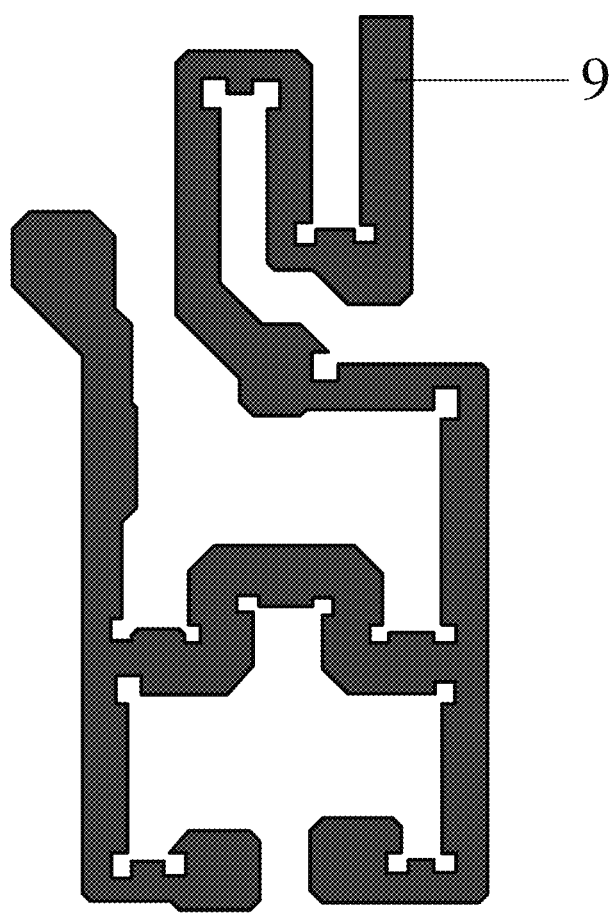
FIG. 1C-FIG. 1F are schematic diagrams of each layer in FIG. 1B.

FIG. 1C shows the active layer 9 of the sub-pixel unit in FIG. 1B. For example, a material of the active layer 9 is a semiconductor material, such as polysilicon, IGZO, and the like, and is specifically selected according to the required performance of the transistor including the active layer 9. No limitation is imposed to this in the embodiments of the present disclosure. For example, the pixel circuit includes a first thin-film transistor T1, a second thin-film transistor T2, a third thin-film transistor T3, a fourth thin-film transistor T4, a fifth thin-film transistor T5, a sixth thin-film transistor T6, and a seventh thin-film transistor T7 (as described below), and the active layers 9 of the seven transistors as a whole is of the shape illustrated in FIG. 1C.

Figure 1D:
Figure 1D:
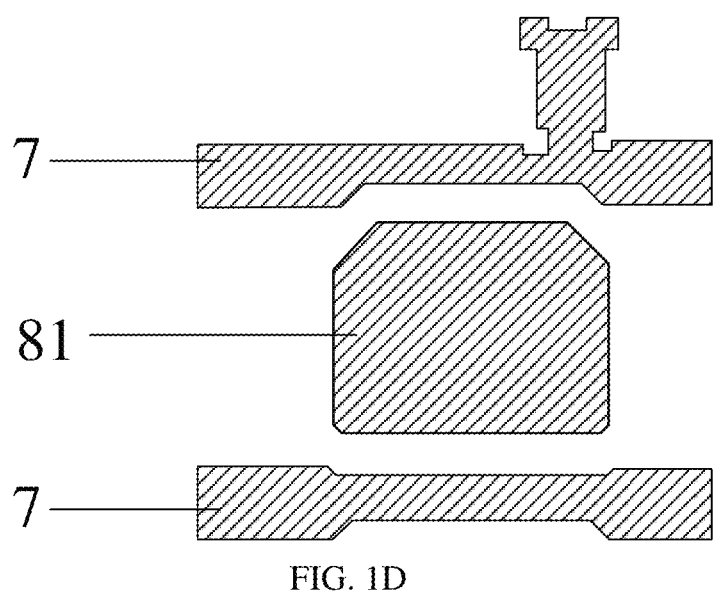

FIG. 1D shows the gate electrode 7 of the sub-pixel unit in FIG. 1B. In FIG. 1B, the gate electrode 7 is stacked with the active layer 9 to form the first thin film transistor T1, the second thin film transistor T2, the third thin film transistor T3, the fourth thin film transistor T4, the fifth thin film transistor T5, the sixth thin film transistor T6, and the seventh thin film transistor T7. It should be noted that in the embodiments of the present disclosure, the pixel structure and the pixel circuit are described taking the case illustrated in FIG. 1B as an example, but the pixel structure and the pixel circuit are not limited to the case of the above-mentioned seven thin film transistors.

For example, a material of the gate electrode 7 is a metal material, such as copper, aluminum, copper alloy, aluminum alloy, silver, and the like, but is not limited to the types listed above, and no limitation is imposed to this in the embodiments of the present disclosure.

As illustrated in FIG. 1D, the gate electrode 7 is in the same layer as the first electrode plate 81 of the storage capacitor and comprises a same material as the first electrode plate 81. In this way, the gate electrode 7 and the first electrode plate 81 of the storage capacitor are simultaneously formed by performing one same patterning process on a same material layer, thus simplifying the manufacturing process of the array substrate.

Figure 1E:
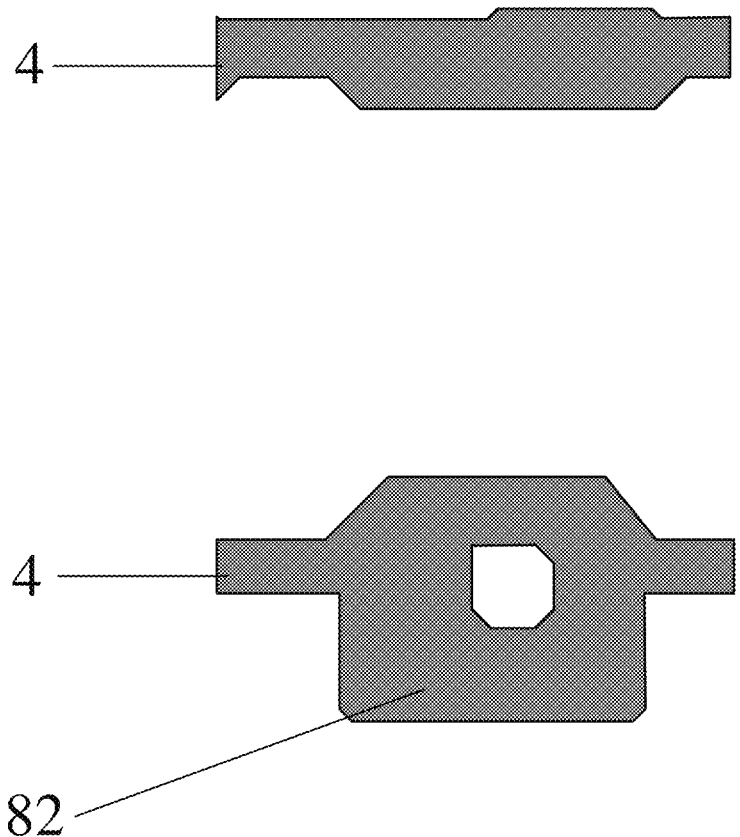

As illustrated in FIG. 1E, the auxiliary wires 4 are in the same layer as the second electrode plate 82 of the storage capacitor and comprise a same material as the second electrode plate 82. For example, the second electrode plate 82 and at least one auxiliary wire of the plurality of auxiliary wires 4 are integral with each other, that is, the at least one auxiliary wire 4 is electrically connected to the second electrode plate 82 of the storage capacitor. For example, a width of the second electrode plate 82 in the first direction is larger than a width of each auxiliary wire 4 in the first direction. The manufacturing process of the array substrate are further simplified by simultaneously forming the plurality of auxiliary wires 4 and the second polar plate 82 of the storage capacitor by performing one same patterning process on a same material layer.

Referring to FIG. 1A-FIG. 1F, FIG. 2 and FIG. 4, for example, the array substrate 100 further includes an insulation layer 5, and the insulation layer 5 is between the plurality of first wires 1 and the second electrode plate 82 and includes a plurality of first via holes 50. Because the auxiliary wires 4 are in the same layer as the second electrode plate 82 of the storage capacitor and comprise the same material as the second electrode plate 82, the insulation layer 5 is between the plurality of first wires 1 and the plurality of auxiliary wires 4. A part 50-1 (some first via holes) of the plurality of first via holes 50 are at the first intersection points, and the plurality of auxiliary wires 41 are respectively electrically connected to the plurality of portions 1111 and 1112 of the first sub-wire through the part 50-1 of the plurality of first via holes 50; another part 50-2 (some other first via holes) of the plurality of first via holes 50 are at the second intersection points, and the plurality of auxiliary wires 4 are respectively electrically connected to the second sub-wire 12 through the another part 50-2 of the first via holes 50.

Figure 1F:
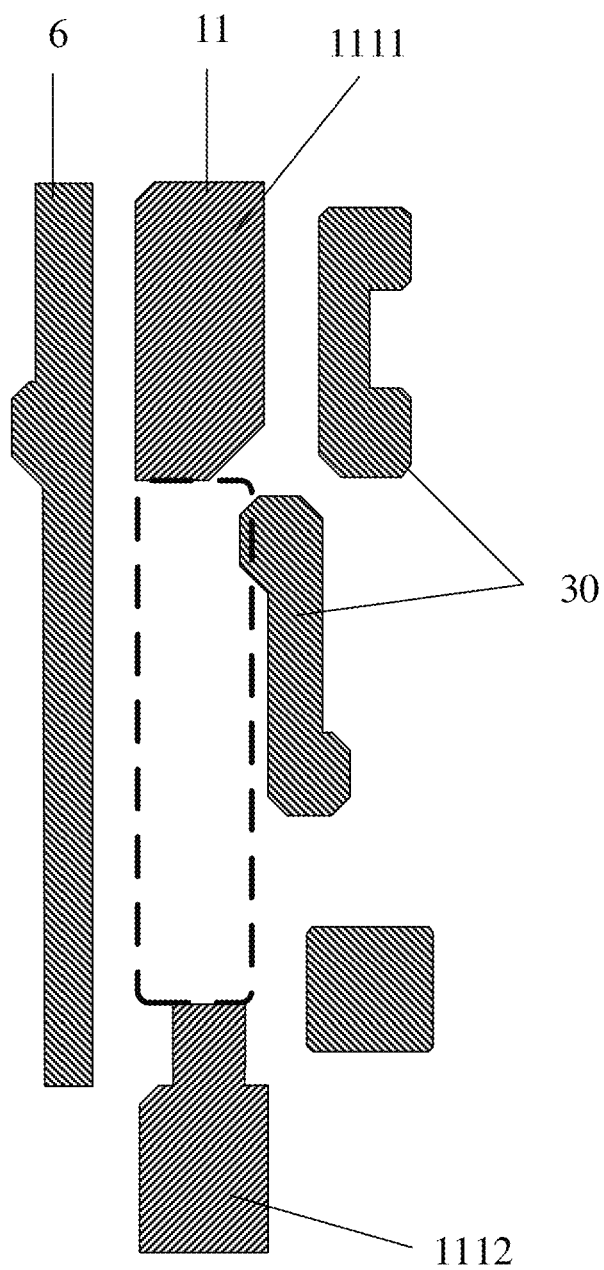

For example, as illustrated in FIG. 1A, FIG. 1B and FIG. 1F, the array substrate 100 further includes a data line 6. The data line 6 is configured to provide a data signal for controlling a light emitting state of the light emitting layer to the light emitting element if the power signal is applied to the light emitting element, and is disposed in the same layer as the first wires 1 and comprises the same material as the first wires 1. In this way, the first wires 1 and the data line 6 are simultaneously formed by performing one same patterning process on a same material layer, thus simplifying the manufacturing process of the array substrate.

For example, combining FIG. 1A, FIG. 1B, FIG. 1F and FIG. 4, the array substrate 100 further includes a second via hole 51 penetrating through the insulation layer 5, the second electrode plate 82 of the storage capacitor and a dielectric layer 83. The dielectric layer 83 is provided between the first electrode plate 81 and the second electrode plate 82. The data connection line 30 is electrically connected to the first electrode plate 81 of the storage capacitor through the second via hole 51. One terminal, away from the first electrode plate 81, of the data connection line 30 is connected to the source electrode or the drain electrode of one or more thin film transistors of the pixel circuit. Specific connection manners may be referred to the following equivalent circuit diagram.

For example, in at least one embodiment, areas of the first electrodes 21 of the plurality of sub-pixel units in each of the plurality of pixel units are different (for example different from each other), the plurality of sub-pixel units in each of the plurality of pixel units include a first sub-pixel unit, and an area of the first electrode 21 of the first sub-pixel unit is the smallest among the first electrodes of the plurality of sub-pixel units in each of the plurality of pixel units. The opening is not in the light emitting region of the first sub-pixel unit, and the opening is in the light emitting regions of other sub-pixel units except the first sub-pixel unit. Therefore, the array substrate provided by the embodiment of the disclosure ensures the uniformity of luminous brightness of the plurality of sub-pixel units while improving the light transmittance.

For example, in at least one embodiment, in the plurality of sub-pixel units of each of the plurality of pixel units, overlapping areas between an orthographic projection of the first sub-wire on a plane where the first electrode corresponding to the first sub-wire is located and the first electrode corresponding to the first sub-wire are different, for example, different from each other; the plurality of sub-pixel units in each of the plurality of pixel units include the first sub-pixel unit; and among the plurality of sub-pixel units in each of the plurality of pixel units, the overlapping area between the orthographic projection of the first sub-wire on the plane where the first electrode corresponding to the first sub-wire is located and the first electrode corresponding to the first sub-wire is the smallest. The opening is not in the light emitting region of the first sub-pixel unit, and the opening is in the light emitting regions of other sub-pixel units except the first sub-pixel unit.

Illustratively, as illustrated in FIG. 1A, each of the plurality of pixel units includes a red sub-pixel unit (R) emitting red light, a green sub-pixel unit (G) emitting green light, and a blue sub-pixel unit (B) emitting blue light. The red sub-pixel unit, the green sub-pixel unit, and the blue sub-pixel unit are respectively provided with a first electrode 211, a first electrode 212, and a first electrode 213. For example, the opening 31 (in the block of the dotted line in the figure) is in the light emitting region of the red sub-pixel unit, and the opening 31 does not overlap with the first electrode 211 of the red sub-pixel unit in the direction perpendicular to the array substrate 100, that is, the orthographic projection of the opening 31 on the array substrate 100 does not overlap with the orthographic projection of the first electrode 211 on the array substrate 100. The opening 32 (in the block of the dotted line in the figure) is in the light emitting region of the blue sub-pixel unit; the opening is not in the light emitting region of the green sub-pixel unit. Considering the differences in shapes and positions of the first electrodes 21 respectively in the R, G and B sub-pixel units, the relative relationships between the first electrodes 21 respectively in the R, G and B and the first sub-wire 11 under the respective first electrode 21 are different. In FIG. 1A, in the R and B sub-pixel units, the overlapping area between the orthographic projection of the first sub-wire 11 on the plane where the first electrode 21 corresponding to the first sub-wire 11 is located and the first electrode 21 corresponding to the first sub-wire 11 is smaller than that in the G, and providing the openings 31 and 32 is beneficial to improving the light transmittance of the R and B. In FIG. 1A, in the G sub-pixel unit, the overlapping area between the orthographic projection of the first sub-wire 11 on the plane where the first electrode 21 corresponding to the first sub-wire 11 is located and the first electrode 21 corresponding to the first sub-wire 11 is larger than those in the R and B sub-pixel units, therefore even if the opening is provided in the G sub-pixel unit, the effect of improving the pixel transmittance is not obvious. Therefore, no opening is provided in the G sub-pixel unit to simplify the manufacturing process of the array substrate. Of course, in other embodiments, each sub-pixel unit includes the opening. For example, each of the red sub-pixel unit (R), the green sub-pixel unit (G), and the blue sub-pixel unit (B) in each pixel unit includes the opening.

For example, the first electrode of the light emitting element is the anode, the first wires and the first electrode of the light emitting element all are opaque. For example, a material of the first wires 1 and a material of the first electrode 21 of the light emitting element all are a metal material, such as copper alloy, aluminum alloy, copper, aluminum, silver, and the like. However, they are not limited to the metal materials, but may also be other opaque conductive materials.

The pixel circuit for example is applied to the sub-pixel units of the array substrate. The pixel circuit includes a driving circuit, a data writing circuit, a compensation circuit, a first light emission control circuit, a second light emission control circuit, a reset circuit, and the light emitting element. Embodiments of the present disclosure include, but are not limited to, this solution. The pixel circuit for example includes both N-type transistors and P-type transistors.

It should be noted that in the embodiments of the present disclosure, the pixel circuit is described by taking a mode of voltage driving as an example. For example, a first voltage terminal VDD in the following is input a DC high level signal which is referred to as a first voltage; for example, a second voltage terminal VSS is input a DC low level signal which is referred to as a second voltage and is lower than the first voltage. The following embodiments are the same in this aspect which is not repeated.

It should be noted that in the description of the embodiments of the present disclosure, a first node N1, a second node N2, a third node N3, and a fourth node N4 do not represent actual components, but rather represent junction points of the connections of the related circuits in the circuit diagram.

It should be noted that in the description of the embodiments of the present disclosure, the symbol Vdata represents the data signal terminal or the data signal level. Similarly, the symbol Vinit represents the reset voltage terminal or the reset voltage, the symbol VDD represents the first voltage terminal or the first voltage, and the symbol VSS represents the second voltage terminal or the second voltage. The following embodiments are the same in this aspect which is not repeated.

Figure 5:
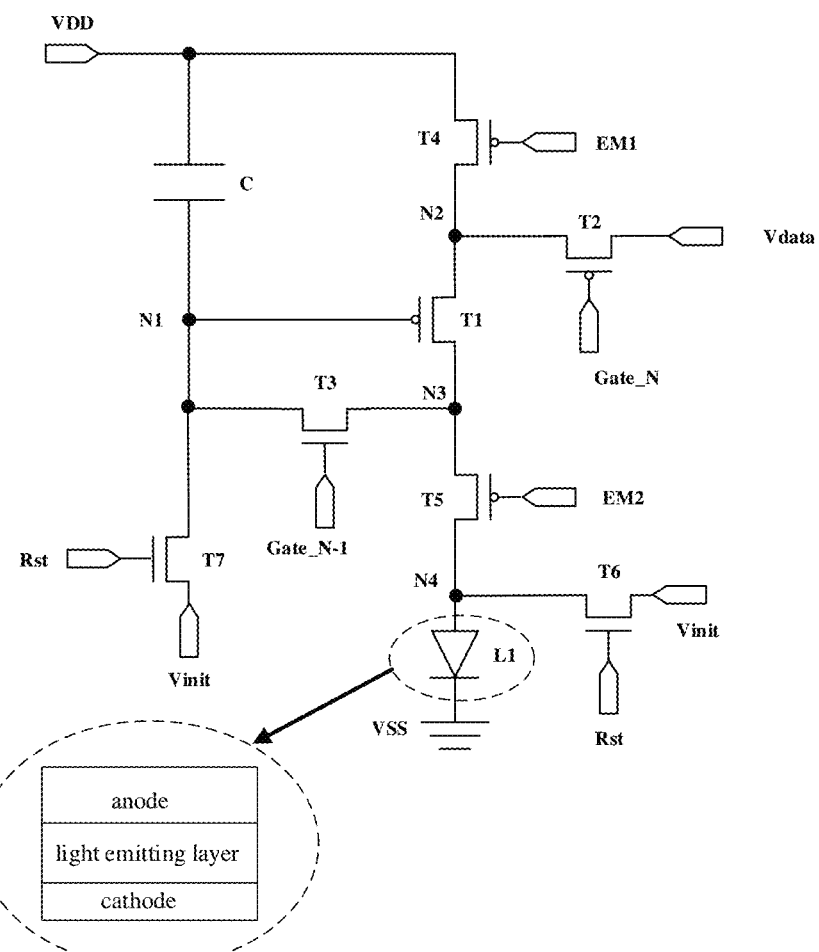
FIG. 5 is an equivalent circuit diagram of a pixel circuit of the sub-pixel unit in FIG. 1B.

FIG. 5 is an equivalent circuit diagram of the pixel circuit of the sub-pixel unit in FIG. 1B. Referring to FIG. 1B and FIG. 5, the pixel circuit includes the first transistor T1, the second transistor T2, the third transistor T3, the fourth transistor T4, the fifth transistor T5, the sixth transistor T6, the seventh transistor T7, the storage capacitor C, and the light emitting element L1. For example, the light emitting element L1 may be various types of OLED, such as of top emission, bottom emission, double-sided emission, etc., and may emit red light, green light, blue light, white light, etc. No limitation is imposed to this in the embodiments of the present disclosure.

For example, as illustrated in FIG. 5, the driving circuit is implemented as the first transistor T1. A gate electrode of the first transistor T1 serves as a control terminal of the driving circuit and is connected to the first node N1. A first electrode of the first transistor T1 serves as a first terminal of the driving circuit and is connected to the second node N2. A second electrode of the first transistor T1 serves as a second terminal of the driving circuit and is connected to the third node N3. For example, the first transistor T1 is a P-type transistor. For example, the P-type transistor is turned on in response to a low-level signal, and the following embodiment are the same in this aspect which is not described again. It should be noted that in the embodiments of the present disclosure, the pixel circuit illustrated in FIG. 1A and FIG. 5 is taken as an example, but the embodiments of the present disclosure are not limited to this case. For example, in other embodiments, the pixel circuit may be different from this. For example, the driving circuit may also be a circuit composed of other components.

For example, the data writing circuit is implemented as the second transistor T2. A gate electrode of the second transistor T2 is connected to a first scan line (a first scan signal terminal Gate_N) to receive a first scan signal, a first electrode of the second transistor T2 is connected to the data line (a data signal terminal Vdata) to receive a data signal, and a second electrode of the second transistor T2 is connected to the first terminal of the driving circuit (the second node N2). For example, the second transistor T2 is a P-type transistor, for example, the active layer comprises a low temperature doped polysilicon. It should be noted that the data writing circuit is not limited to this case, but may also be a circuit composed of other components.

For example, the compensation circuit is implemented as the third transistor T3 and the storage capacitor C. A gate electrode of the third transistor T3 is configured to be connected to a second scan line (a second scan signal terminal Gate_N−1) to receive a second scan signal, a first electrode of the third transistor T3 is connected to the control terminal (the first node N1) of the driving circuit, and a second electrode of the third transistor T3 is connected to the second terminal (the third node N3) of the driving circuit; the first electrode plate of the storage capacitor C is connected to the control terminal of the driving circuit, and the second electrode plate of the storage capacitor C is connected to the first voltage terminal VDD. The third transistor T3 is an N-type transistor. For example, the N-type transistor is used, IGZO is used as the active layer of the thin film transistor to reduce the size of the driving transistor and prevent the leakage current. For example, the N-type transistor is turned on in response to a high-level signal, and the following embodiments are the same as this in this respect which is not described again. It should be noted that the compensation circuit is not limited to this case, but may also be a circuit composed of other components.

For example, the first light emission control circuit is implemented as the fourth transistor T4. A gate electrode of the fourth transistor T4 is connected to a first light emission control line (a first light emission control terminal EM1) to receive a first light emission control signal, a first electrode of the fourth transistor T4 is connected to the first voltage terminal VDD to receive the first voltage, and a second electrode of the fourth transistor T4 is connected to the first terminal (the second node N2) of the driving transistor. The fourth transistor T4 is a P-type transistor, for example, the active layer is made of the low temperature doped polysilicon. It should be noted that the first light emission control circuit is not limited to this case, and may also be a circuit composed of other components.

A first terminal (an anode here) of the light emitting element L1 is connected to the fourth node N4 and is configured to receive a driving current from the second terminal of the driving circuit through the second light emission control circuit, and a second terminal (for example, a cathode) of the light emitting element L1 is connected to the second voltage terminal VSS to receive the second voltage. For example, the second voltage terminal is grounded, i.e., the second voltage from the second voltage terminal VSS is 0V. The light emitting layer is provided between the anode and the cathode.

For example, the second light emission control circuit is implemented as a fifth transistor T5. A gate electrode of the fifth transistor T5 is connected to a second light emission control line (A second light emission control terminal EM2) to receive a second light emission control signal, A first electrode of the fifth transistor T5 is connected to the second terminal (the third node N3) of the driving circuit, and a second electrode of the fifth transistor T5 is connected to the first terminal (the fourth node N4) of the light emitting element L1. For example, the fifth transistor T5 is a P-type transistor, for example, the active layer is made of the low temperature doped polysilicon. It should be noted that the second light emission control circuit is not limited to this case, and may also be a circuit composed of other components.

For example, the reset circuit is implemented as the sixth transistor T6 and the seventh transistor T7. A gate electrode of the sixth transistor T6 is connected to the second scan line (a first reset control terminal Rst) to receive the second scan signal as a first reset signal, a first electrode of the sixth transistor T6 is connected to the reset voltage terminal Vinit to receive the reset voltage, and a second electrode of the sixth transistor T6 is connected to the first terminal of the light emitting element. A gate electrode of the seventh transistor T7 is also connected to the second scan line (the reset control terminal Rst) to receive the second scan signal as a reset signal, a first electrode of the seventh transistor T7 is connected to the reset voltage terminal Vinit to receive the reset voltage, and a second electrode of the seventh transistor T7 is connected to the gate electrode of the first transistor T1 (the first node N1). For example, the sixth transistor T6 and the seventh transistor T7 are N-type transistors, for example, the active layer is made of IGZO. It should be noted that the reset circuit is not limited to this case, but may also be a circuit composed of other components.

In the embodiments of the present disclosure, the pixel circuit include N-type transistors and P-type transistors, for example, the third transistor T3, the sixth transistor T6 and the seventh transistor T7 are N-type transistors, and other transistors are P-type transistors. The leakage current of the N-type transistor is small, therefore the flicker phenomenon can be overcome when the pixel circuit is used for low-frequency driving; the third transistor T3 of the compensation circuit in the pixel circuit adopts the N-type transistor with a small leakage current and a smaller size, therefore the storage capacitor C of the compensation circuit may be a capacitor with a smaller size, thereby increasing the resolution of the display panel; meanwhile, because the leakage current of the N-type transistor is small, it is not necessary to consider the aging problem of the N-type transistor.

In the following, an operation principle of the pixel circuit 10 illustrated in FIG. 5 is described with reference to a signal timing chart illustrated in FIG. 6A.

Figure 6A:
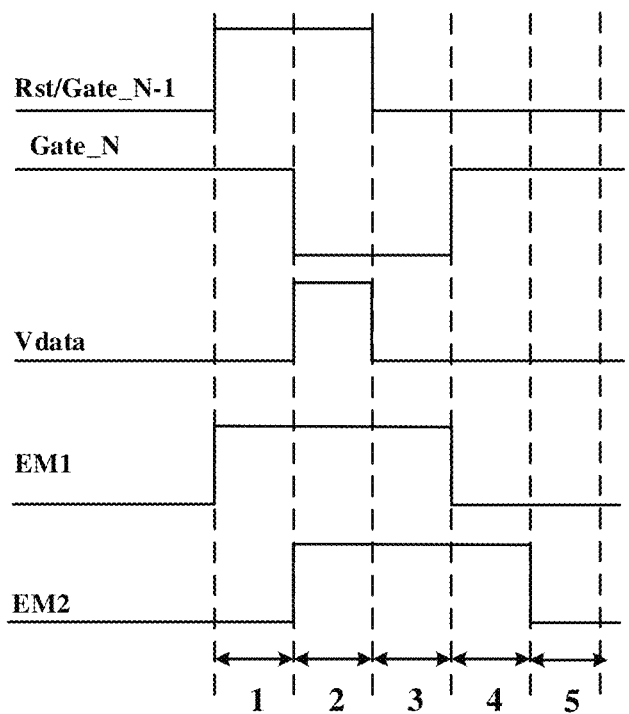
FIG. 6A is a signal timing chart of an operation process of the pixel circuit illustrated in FIG. 5.

As illustrated in FIG. 6A, the display process of each frame image includes five stages, namely an initialization stage 1, a data writing and compensation stage 2, a data writing and holding stage 3, a pre-light emitting stage 4 and a light emitting stage 5. The figure shows the timing waveform of each signal in each stage.

Figure 6B:
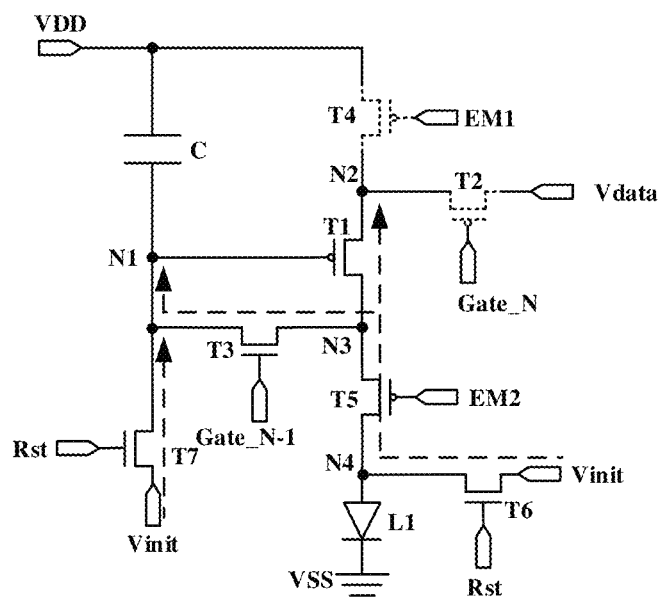
FIG. 6B is a schematic diagram of the pixel circuit illustrated in FIG. 5 at an initialization stage 1.
Figure 6C:
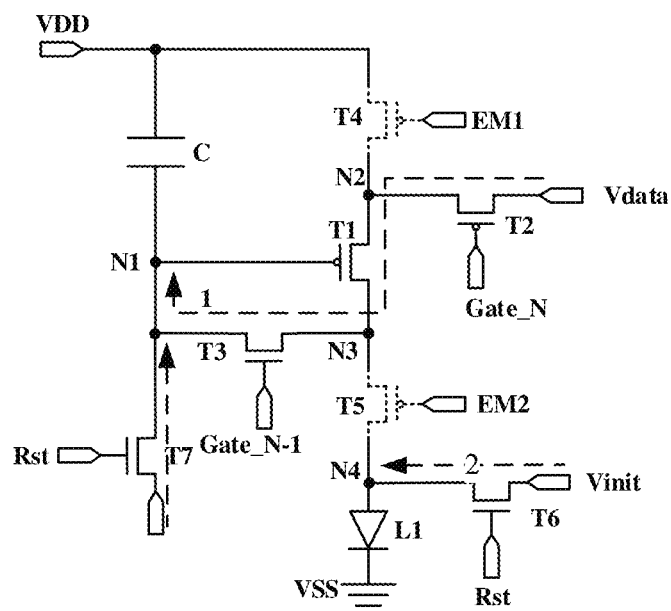
FIG. 6C is a schematic diagram of the pixel circuit illustrated in FIG. 5 in a data writing and compensation stage 2.
Figure 6D:
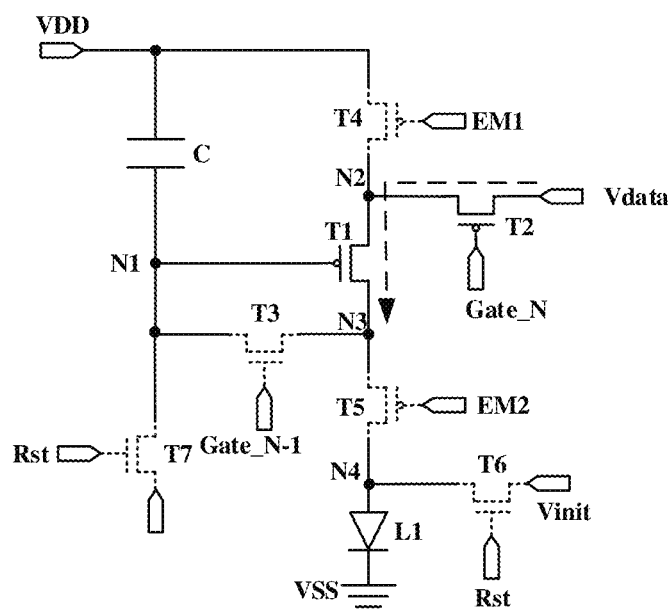
FIG. 6D is a schematic diagram of the pixel circuit illustrated in FIG. 5 in a data writing and holding stage 3.
Figure 6E:
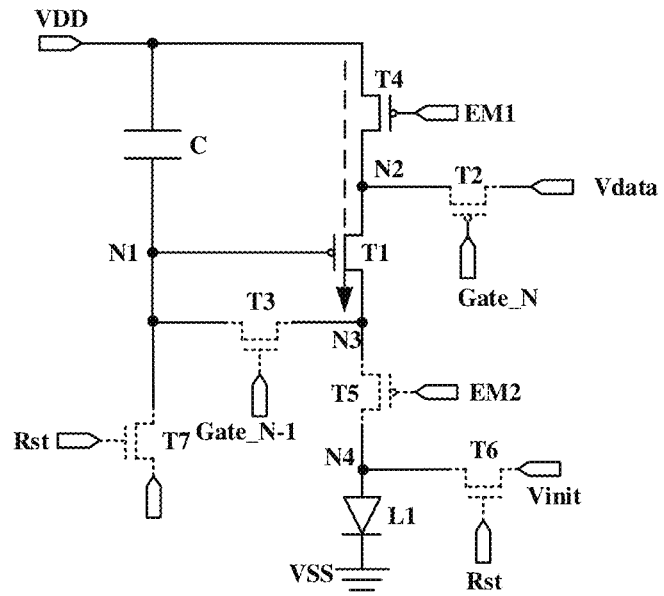
FIG. 6E is a schematic diagram of the pixel circuit illustrated in FIG. 5 in a pre-light emitting stage 4.
Figure 6F:
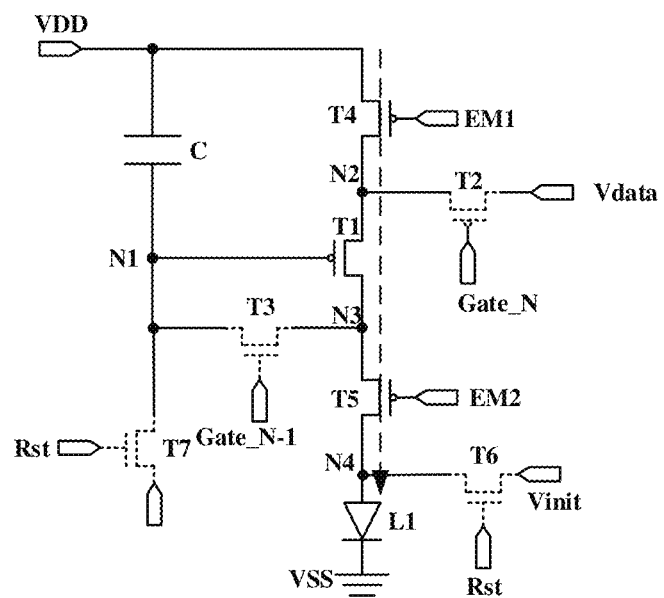
FIG. 6F is a schematic diagram of the pixel circuit illustrated in FIG. 5 in a light emitting stage 5.

It should be noted that FIG. 6B is a schematic diagram when the pixel circuit illustrated in FIG. 5 is in the initialization stage 1, FIG. 6C is a schematic diagram when the pixel circuit illustrated in FIG. 5 is in the data writing and compensation stage 2, FIG. 6D is a schematic diagram when the pixel circuit illustrated in FIG. 5 is in the data writing and holding stage 3, FIG. 6E is a schematic diagram when the pixel circuit illustrated in FIG. 5 is in the pre-light emitting stage 4, and FIG. 6F is a schematic diagram when the pixel circuit illustrated in FIG. 5 is in the light emitting stage 5. In addition, all the transistors identified by dashed lines in FIG. 6B to FIG. 6F indicate that they are in an off state in the corresponding stage, and the dashed lines with arrows in FIG. 6B to FIG. 6F indicate the current direction of the pixel circuit in the corresponding stage. The transistors illustrated in FIG. 6B to FIG. 6F are all explained by taking the example that the third transistor T3, the sixth transistor T6 and the seventh transistor T7 are N-type transistors, and the other transistors are P-type transistors, i.e., each of the N-type transistor is turned on when the high level signal is applied to the gate electrode thereof and is turned off when the low level signal is applied to the gate electrode thereof, and each of the P-type transistor is turned on when the low level signal is applied to the gate electrode thereof and is turned off when the high level signal is applied to the gate electrode thereof. The following examples are the same in this aspect which is not described again.

In the initialization stage 1, a reset signal, a second scan signal and a second light emission control signal are input to turn on the reset circuit, the compensation circuit and the second light emission control circuit, and the reset voltage is applied to the control terminal of the driving circuit, the first terminal of the driving circuit, the second terminal of the driving circuit and the first terminal of the light emitting element. For example, as illustrated in FIG. 6A, the second scan signal is synchronized with the reset signal, i.e., the reset signal may be the second scan signal, and the following embodiments are the same as the above in this respect which is not described again.

As illustrated in FIG. 6A and FIG. 6B, in the initialization stage 1, because the third transistor T3, the sixth transistor T6 and the seventh transistor T7 are N-type transistors, the sixth transistor T6 and the seventh transistor T7 are turned on by the high level of the reset signal, the third transistor T3 is turned on by the high level of the second scan signal, and the fifth transistor T5 is turned on by the low level of the second light emission control signal. Meanwhile, the second transistor T2 is turned off by the high level of the first scan signal, and the fourth transistor T4 is turned off by the high level of the first light emission control signal.

As illustrated in FIG. 6B, in the initialization stage 1, a reset path is formed (as illustrated by the dashed line with arrow in FIG. 6B). Therefore, in this stage, the storage capacitor C and the gate electrode of the first transistor T1 are discharged through the third transistor T3, the fifth transistor T5 and the sixth transistor T6, the first transistor T1 is discharged through the fifth transistor T5 and the sixth transistor T6, and the light emitting element L1 is discharged through the sixth transistor T6, thereby the first node N1, the second node N2, the third node N3, and the light emitting element L1 (i.e., the fourth node N4) are reset. Meanwhile, the reset signal is directly supplied to the first node N1 through the seventh transistor T7 to ensure that the first node N1 is reset. Therefore, all the potentials of the first node N1, the third node N3, and the fourth node N4 after the initialization stage 1 are the reset voltages Vinit (low level signals, for example, grounded signals or other low level signals). In this stage, because the first transistor T1 and the fifth transistor T5 are turned on and the fourth transistor T4 is turned off, the potential of the source electrode of the first transistor T1 (i.e., the second node N2) is discharged to Vinit−Vth according to the characteristics of the first transistor T1. Therefore, in this stage, a voltage $V_{GS}$ between the gate electrode (i.e., the first node N1) and the source electrode (i.e., the second node N2) of the first transistor T1 satisfies a condition of $|V_{GS}|<|Vth|$, thereby allowing the first transistor T1 in an off-bias state where the voltage $V_{GS}$ is in fixed bias. With this configuration, whether the data signal of a previous frame is a black signal or a white signal, the first transistor T1 begins to enter the data writing and compensation stage 2 from the off-bias state, thereby alleviating the short-term afterimage problem possibly caused by the hysteresis effect of the display device adopting the pixel circuit.

After the initialization stage 1, the potential of the first node N1 is the reset voltage Vinit, and the potential of the second node N2 is Vinit−Vth. In the initialization stage 1, the storage capacitor C is reset to discharge the voltage stored in the storage capacitor C, so that data signals in subsequent stages can be stored in the storage capacitor C more quickly and reliably. Meanwhile, the third node N3 and the light emitting element L1 (i.e., the fourth node N4) are also reset, so that the light emitting element L1 is in the black state without emitting light before the light emitting stage 5, and display effects such as contrast of a display device adopting the pixel circuit described above are improved.

In the data writing and compensation stage 2, the first scan signal, the second scan signal and the data signal are input to turn on the data writing circuit, the driving circuit and the compensation circuit, the data writing circuit writes the data signal into the driving circuit, the compensation circuit stores the data signal, and the compensation circuit compensates the driving circuit.

As illustrated in FIG. 6A and FIG. 6C, in the data writing and compensation stage 2, the second transistor T2 is turned on by the low level of the first scan signal, and the third transistor T3 is turned on by the high level of the second scan signal. In this example, because the second scan signal is a reset signal, the sixth transistor T6 and the seventh transistor T7 are turned on by the high level of the reset signal. Meanwhile, the fourth transistor T4 is turned off by the high level of the first light emission control signal, and the fifth transistor T5 is turned off by the high level of the second light emission control signal.

As illustrated in FIG. 6C, in the data writing and compensation stage 2, a data writing and compensation path (illustrated by dashed line 1 with arrow in FIG. 6C) and a reset path (illustrated by dashed line 2 with arrow in FIG. 6C) are formed. The first node N1 is charged by the data signal (i.e., the storage capacitor C is charged) after the data signal passes through the second transistor T2, the first transistor T1 and the third transistor T3, that is, the potential of the first node N1 increases. It is easy to understand that the potential of the second node N2 is kept at Vdata; and at the same time, according to the own characteristics of the first transistor T1, when the potential of the first node N1 increases to Vdata+Vth, the first transistor T1 is turned off, and the charging process terminals. It should be noted that Vdata represents the voltage value of the data signal, and Vth represents the threshold voltage of the first transistor. In the embodiments, the first transistor T1 is described by taking a P-type transistor as an example, so the threshold voltage Vth may be a negative value herein. Meanwhile, in this stage, the fourth node N4 continues being discharged through the sixth transistor T6, therefore the voltage of the fourth node N4 is still the reset voltage Vinit. It should be noted that in this stage, the reset circuit may also be turned off in response to other reset signals without affecting the subsequent light emitting stage of the pixel circuit, and no limitation is imposed to this in the embodiments of the present disclosure.

After the data writing stage 2, both the potentials of the first node N1 and the third node N3 are Vdata+Vth, that is, voltage information with the data signal and the threshold voltage Vth is stored in the storage capacitor C for providing a gray scale display data and compensating the threshold voltage of the first transistor T1 in the subsequent light emitting stage.

In the data writing and holding stage 3, the first scan signal is input to turn on the data write circuit, and the second scan signal is input to turn off the compensation circuit to keep the voltage of the control terminal of the driving circuit.

As illustrated in FIG. 6A and FIG. 6D, in the data writing and holding stage 3, the second transistor T2 is turned on by the low level of the first scan signal; meanwhile, the third transistor T3 is turned off by the low level of the second scan signal. In this example, because the second scan signal is a reset signal, the sixth transistor T6 and the seventh transistor T7 are turned off by the low level of the reset signal, the fourth transistor T4 is turned off by the high level of the first light emission control signal, and the fifth transistor T5 is turned off by the high level of the second light emission control signal.

As illustrated in FIG. 6D, in the data writing and holding stage 3, a data writing and holding path is formed (as illustrated by a dashed line with an arrow in FIG. 6D). In this stage, the third transistor T3 is turned off, and the potential of the first node N1 is kept at Vdata+Vth because of the characteristic of the storage capacitor.

After the data writing and holding stage 3, the potential of the first node N1 is kept at Vdata+Vth. That is, the voltage information with the data signal and the threshold voltage Vth is continuously stored in the storage capacitor C for providing the gray scale display data and compensating the threshold voltage of the first transistor T1 in the subsequent light emitting stage.

In the pre-lighting stage 4, the first lighting control signal is input to turn on the first lighting control circuit and the driving circuit, and the first lighting control circuit applies the first voltage to the first terminal 110 of the driving circuit.

As illustrated in FIG. 6A and FIG. 6E, the fourth transistor T4 is turned on by the low level of the first light emission control signal in the pre-light emitting stage 4. Meanwhile, the second transistor T2 is turned off by the high level of the first scan signal, the third transistor T3 is turned off by the low level of the second scan signal, the sixth transistor T6 and the seventh transistor T7 are turned off by the low level of the reset signal, and the fifth transistor T5 is turned off by the high level of the second light emission control signal.

As illustrated in FIG. 6E, in the pre-light emitting stage 4, a pre-light emitting path is formed (as illustrated by the dotted line with arrows in FIG. 6E). The first voltage charges the second node N2 through the fourth transistor T4, and the potential of the second node N2 changes from Vdata to the first voltage VDD. Because the fifth transistor T5 is turned off in this stage, it is prepared for light emission of the light emitting element L1 in the next stage.

In the light emitting stage 5, the first light emission control signal and the second light emission control signal are input to turn on the first light emission control circuit, the second light emission control circuit and the driving circuit, and the second light emission control circuit applies the driving current to the light emitting element L1 to enable it to emit light.

As illustrated in FIG. 6A and FIG. 6F, in the light emitting stage 5, the fourth transistor T4 is turned on by the low level of the first light emission control signal, and the fifth transistor T5 is turned on by the low level of the second light emission control signal. Meanwhile, the second transistor T2 is turned off by the high level of the first scan signal, the third transistor T3 is turned off by the low level of the second scan signal, and the sixth transistor T6 and the seventh transistor T7 are turned off by the low level of the reset signal. And meanwhile, the potential of the first node N1 is Vdata+Vth and the potential of the second node N2 is VDD, therefore the first transistor T1 is also kept on in this stage.

As illustrated in FIG. 6F, in the light emitting stage 5, a driving light emitting path is formed (as illustrated by a dotted line with an arrow in FIG. 6F). The light emitting element L1 emits light under the action of the driving current flowing through the first transistor T1.

Specifically, the value of the driving current $I_{L1}$ flowing through the light emitting element L1 is obtained according to the following formula:

$$I_{L1} = K(V_{GS} - Vth)^2 = K[(Vdata + Vth - VDD) - Vth]^2 = K(Vdata - VDD)^2,$$

in which $K=W*C_{OX}*U/L$.

In the above formula, $V_{th}$ represents the threshold voltage of the first transistor T1, $V_{GS}$ represents the voltage between the gate electrode and the source electrode (here, the first electrode) of the first transistor T1, and K is a constant value related to the characteristic of the driving transistor. It can be seen from the above calculation formula of $I_L$ that the driving current $I_{L1}$ flowing through the light emitting element L1 is no longer related to the threshold voltage Vth of the first transistor T1, thus compensation for the pixel circuit is realized, the problem of threshold voltage drift caused by the driving transistor (the first transistor T1 in the embodiments of the present disclosure) because of the manufacturing process and long-term operation is solved, the influence caused by the problem of threshold voltage drift on the driving current $I_{L1}$ is eliminated, and thus the display effect of the display device adopting the pixel circuit is improved.

It should be noted that the transistors used in the embodiments of the present disclosure may be thin film transistors or field effect transistors or other switching devices with the same characteristics, and the embodiments of the present disclosure are all described with thin film transistors as examples. The source electrode and the drain electrode of the transistor mentioned in the embodiments of the present disclosure are symmetrical in structure, therefore the source electrode and the drain electrode are not specifically distinguished in structure. In the embodiments of the present disclosure, in order to distinguish the two electrodes of the transistor except the gate electrode, one electrode is described as the first electrode and the other electrode is described as the second electrode.

In addition, it should be noted that the transistors in the pixel circuit illustrated in FIG. 5 are illustrated by taking the third transistor T3, the sixth transistor T6 and the seventh transistor T7 as N-type transistors and other transistors as P-type transistors. In this case, the first electrode may be a drain electrode and the second electrode may be a source electrode. As illustrated in FIG. 6B, the cathode of the light emitting element L1 in the pixel circuit 10 is connected to the second voltage terminal VSS to receive the second voltage. For example, in a display panel, the pixel circuits 10 illustrated in FIG. 6B are arranged in an array, the cathodes of the light emitting elements L1 are electrically connected to the same voltage terminal, i.e., a common cathode connection mode is adopted.

For example, according to the embodiments of the present disclosure, the first light emission control terminal EM1 and the second light emission control terminal EM2 in FIG. 5 are connected to the same light emission control line, in this case, the signal timing applied to the first light emission control terminal EM1 is the same as the signal timing applied to the second light emission control terminal EM2. For example, in at least one embodiment, all the transistors illustrated in FIG. 5 are P-type transistors. In this case, for example, the signal timing diagram of the pixel circuit is illustrated in FIG. 6G.

Figure 6G:
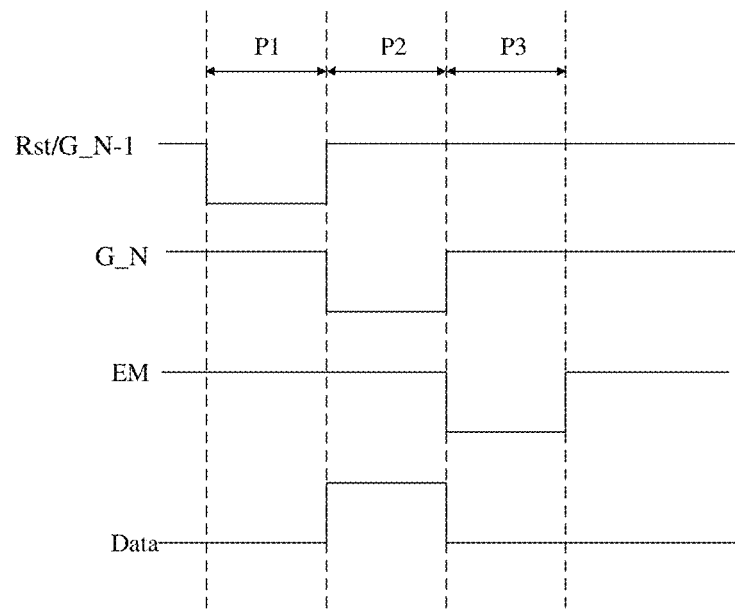
FIG. 6G is another signal timing chart of the operation process of the pixel circuit provided by the embodiments of the present disclosure.

As illustrated in FIG. 6G, the operation process of the pixel circuit includes three stages, namely an initialization stage P1, a data writing and compensation stage P2 and a light emitting stage P3, and the timing waveform of each signal in each stage is illustrated in the figure.

In the initialization stage P1, a reset signal Rst is provided, the seventh transistor T7 and the sixth transistor T6 are turned on by the low level of the reset signal, an initialization signal (low level signal, for example, which is grounded or other low level signal) is applied to the gate electrode of the first transistor T1, and the initialization signal is applied to the N4 node, which resets the light emitting element L1, so that the light emitting element L1 is in the black state without emitting light before the light emitting stage P3, and display effects such as contrast of a display device adopting the pixel circuit are improved. Meanwhile, the second transistor T2, the third transistor T3, the fourth transistor T4, and the fifth transistor T5 are turned off respectively by the inputted high-level signals.

In the data writing and compensation stage P2, a first scan signal is provided through the first scan signal terminal Gate_N, the data signal is provided through the data line, and the second transistor T2 and the third transistor T3 are turned on. Meanwhile, the seventh transistor T7, the fourth transistor T4, the fifth transistor T5, and the sixth transistor T6 are turned off respectively by the inputted high-level signals. The first node N1 is charged (i.e., the storage capacitor C is charged) by the data signal after the data signal passes through the second transistor T2, the first transistor T1 and the third transistor T3, that is, the potential of the first node N1 gradually increases. It is easy to understand that because the second transistor T2 is turned on, the potential of the second node N2 is kept at Vdata; and at the same time, according to the characteristics of the first transistor T1, when the potential of the first node N1 increases to Vdata+Vth, the first transistor T1 is turned off, and the charging process ends. Vdata represents the voltage value of the data signal, and Vth represents the threshold voltage of the first transistor T1.

After the data writing and compensation stage P2, both the potential of the first node N1 and the potential of the third node N3 are Vdata+Vth, that is, voltage information with the data signal and the threshold voltage Vth is stored in the storage capacitor C for providing gray scale display data and compensating the threshold voltage of the first transistor T1 in the light emitting stage.

In the light emitting stage P3, the light emission control line provides the light emission control signal EM, and the fourth transistor T4 and the fifth transistor T5 are turned on by the low level of the light emission control signal EM. The second transistor T2, the third transistor T3, the seventh transistor T7, and the sixth transistor T6 are turned off by respective high level signals. Meanwhile, the potential of the first node N1 is Vdata+Vth, and the potential of the second node N2 is VDD, therefore the first transistor T1 is also kept on in this stage. The anode and the cathode of the light emitting element L1 are respectively provided with the first voltage VDD and the second voltage VSS, so that the light emitting element L1 emits light under the action of the driving current flowing through the first transistor T1.

At least one embodiment of the present disclosure further provides a display panel, and the display panel includes any one of the array substrates provided by the embodiments of the present disclosure.

Figure 7:
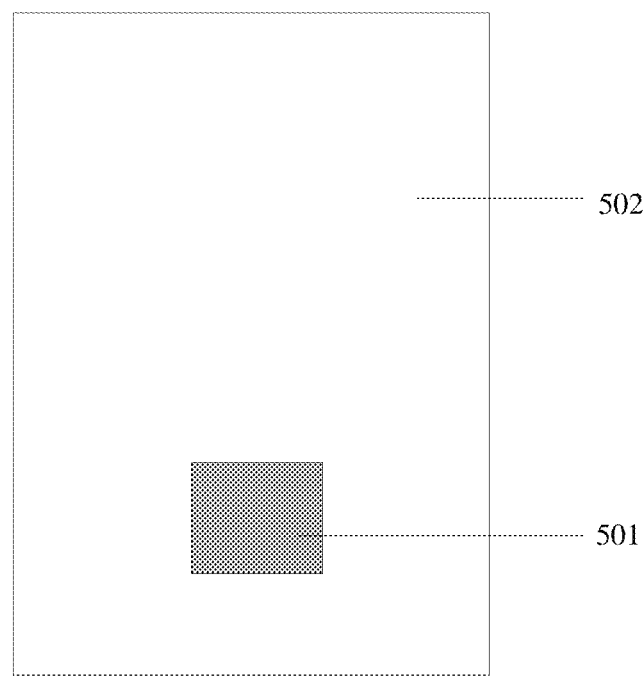
FIG. 7 is a schematic diagram of a display panel provided by the embodiments of the present disclosure.

For example, FIG. 7 is a schematic diagram of the display panel provided by the embodiments of the present disclosure. As illustrated in FIG. 7, a display panel 500 provided by the embodiments of the present disclosure includes any one of the above array substrates.

For example, the display panel 500 further includes a fingerprint recognition device (not illustrated) and a fingerprint recognition region 501. The fingerprint recognition device is disposed on the array substrate and in the fingerprint recognition region 501. For example, at least a part of the opening is in the fingerprint recognition region 501, that is, at least a part of the orthographic projection of the opening on the array substrate or the base substrate is in the fingerprint recognition region 501, so as to improve the light transmittance of the fingerprint recognition region 501, thereby improving the effect of fingerprint recognition, such as improving the accuracy and speed of fingerprint recognition. For example, all the openings are in the fingerprint recognition region 501, or a part of the openings (some of the openings) are in the fingerprint recognition region 501. For example, some of the openings are in a non-fingerprint recognition region.

For example, the display panel 500 further includes the non-fingerprint recognition region 502 except the fingerprint recognition region 501. For example, the opening is not in the non-fingerprint recognition region 502, that is, any part of the orthographic projection of the opening on the array substrate is not in the non-fingerprint recognition region 502. In this way, the openings are only provided in the fingerprint recognition region 501, so that the total number of the openings is reduced and the manufacturing process of the display panel is simplified while the light transmittance of the fingerprint recognition region is improved to meet the light transmittance requirement of fingerprint recognition.

Of course, in other embodiments, the opening is provided in the non-fingerprint recognition region 502 of the display panel 500, that is, the opening is provided in at least a part of the pixel units of the fingerprint recognition region 501 and the non-fingerprint recognition region 502 of the display panel 500.

Other components of the display panel may be designed and implemented by those skilled in the art according to conventional techniques in the art.

At least one embodiment of the present disclosure further provides a display apparatus, and the display apparatus includes any one of the display panels provided by the embodiments of the present disclosure. For example, the display apparatus may be any product or component with a display function such as a mobile phone, a tablet computer, a television, a display, a notebook computer, a digital photo frame, a navigator, etc.

At least one embodiment of the present disclosure further provides a manufacturing method of an array substrate, the array substrate comprises a plurality of pixel units arranged in an array, each of the plurality of pixel units comprises a plurality of sub-pixel units, and each of the plurality of sub-pixel units comprises a light emitting region and a non-light emitting region. The manufacturing method comprises: forming a light emitting element in each of the plurality of sub-pixel units, in which the light emitting element comprises a light emitting layer and a first electrode electrically connected to the light emitting layer, and at least a part of the first electrode is in the light emitting region; and forming a plurality of first wires, in which the plurality of first wires are configured to supply a power signal to the light emitting element, and the plurality of first wires comprises a first sub-wire; the first sub-wire extends along a first direction and comprises a plurality of portions, the plurality of portions are arranged in the first direction and adjacent two portions of the plurality of portions are spaced apart from each other by an opening, and the opening is in the light emitting region; and the first electrode of the light emitting element is stacked with the plurality of first wires in a direction perpendicular to the array substrate, and at least a part of an orthographic projection of the opening on the array substrate does not overlap with an orthographic projection of the first electrode on the array substrate.

Illustratively, FIG. 8A-FIG. 8E are schematic diagrams of the array substrate manufacturing method provided by the embodiments of the present disclosure. The manufacturing method of the array substrate is described with a schematic diagram of forming one sub-pixel unit of the array substrate. For example, a base substrate is provided first.

Figure 8A:
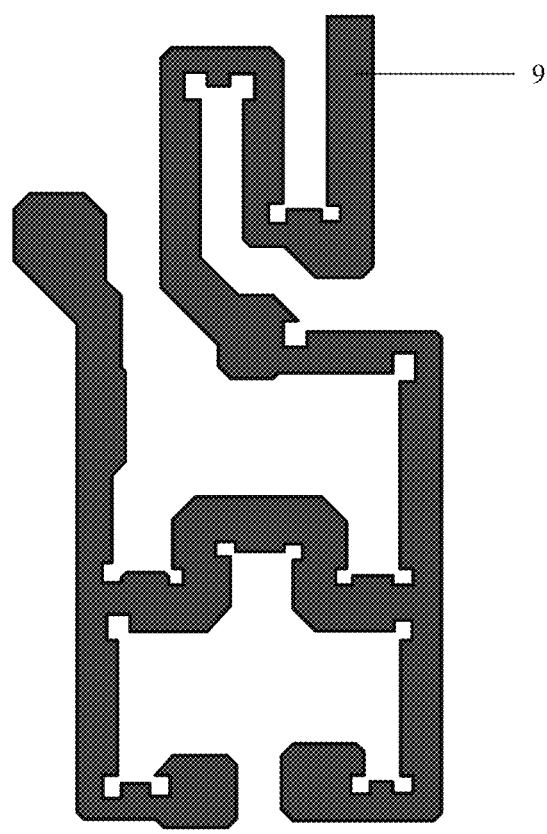
FIG. 8A-FIG. 8E are schematic diagrams of a manufacturing method of an array substrate provided by the embodiments of the present disclosure.

As illustrated in FIG. 8A, an active layer 9 is formed on the base substrate by a patterning process. The material of the active layer 9 may refer to the description in the previous embodiments, and the specific method of forming the active layer 9 may refer to conventional techniques in the art.

Figure 8B:
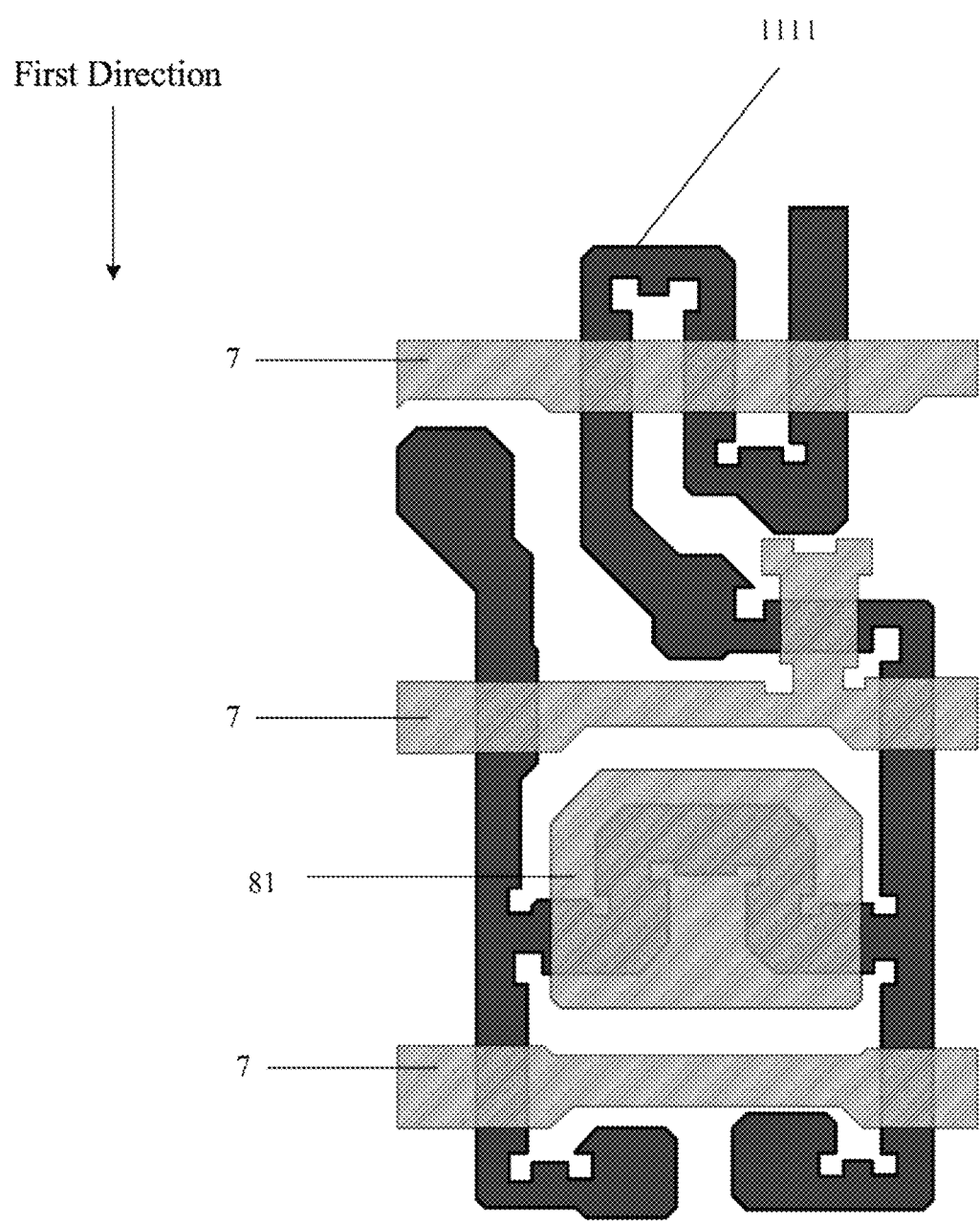

As illustrated in FIG. 8B, the manufacturing method of the array substrate further includes forming a transistor and a storage capacitor; the forming the transistor and the storage capacitor includes: forming a gate metal layer; and performing one patterning process on the gate metal layer to form a gate electrode 7 of the transistor and a first electrode plate 81 of the storage capacitor. In this manufacturing method, the gate electrode 7 and the first electrode plate 81 are formed by performing only one patterning process on the same layer, which is beneficial to simplifying the manufacturing process of the array substrate.

It should be noted that in the embodiments of the present disclosure, in the case where the patterning process is a photolithography process, one patterning process in the present disclosure refers to a process in which one exposure process is performed with one mask.

Figure 8C:
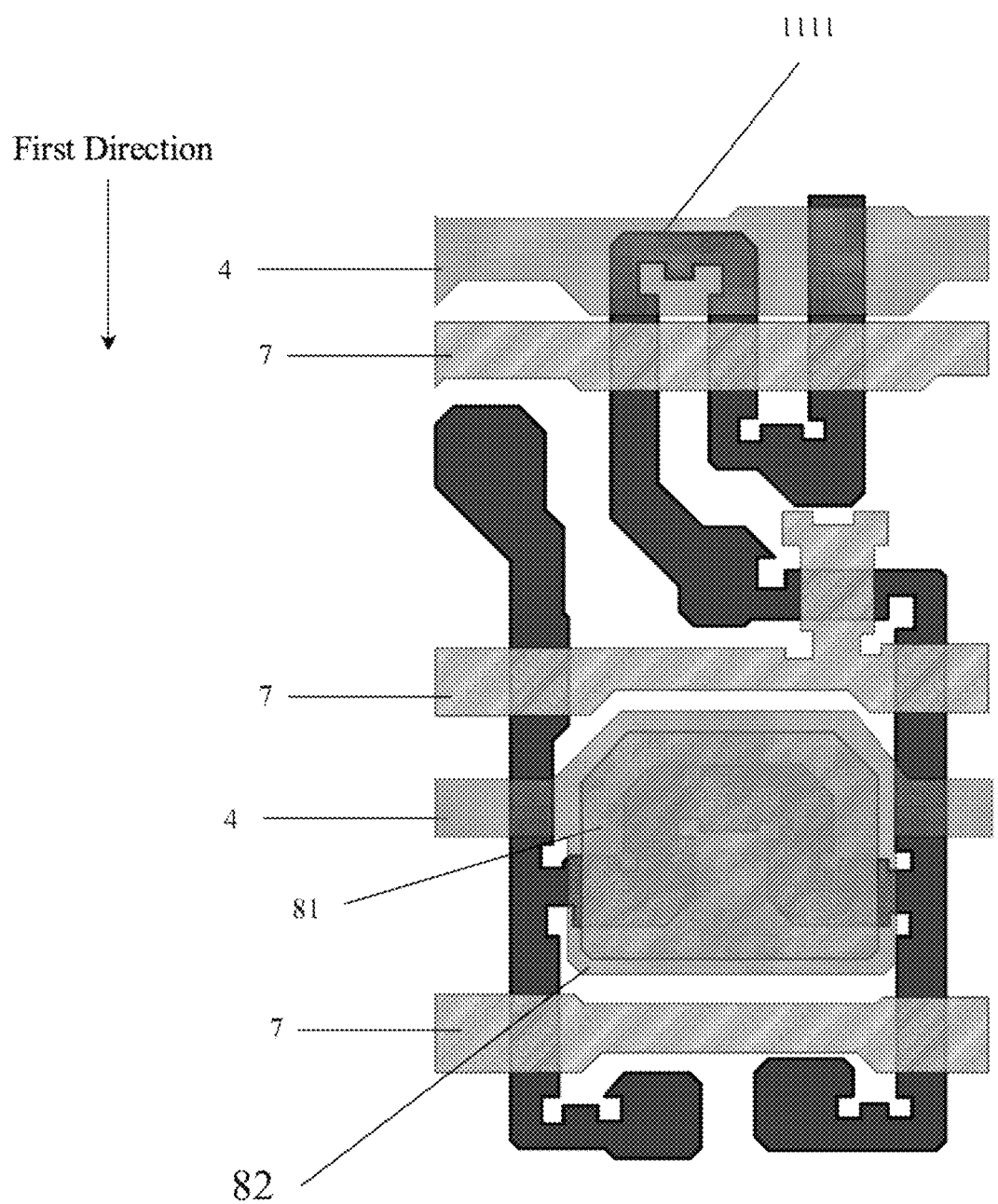

As illustrated in FIG. 8C, the manufacturing method of the array substrate further includes: forming a plurality of auxiliary wires 4. The plurality of auxiliary wires 4 are stacked with the layer in which the gate electrode 7 is located, for example, on a side, away from the base substrate, of the layer in which the gate electrode 7 is located. The plurality of auxiliary wires 4 extend along a second direction intersecting the first direction. For example, a first metal layer is formed, and then a patterning process is performed on the first metal layer to form the plurality of auxiliary wires 4 and a second electrode plate 82 of the storage capacitor, and at least one of the plurality of auxiliary wires 4 and second electrode plate 82 are integral with each other. In this manufacturing method, the auxiliary wires 4 and the second electrode plate 82 are formed by performing only one patterning process on the same layer, which is beneficial to simplifying the manufacturing process of the array substrate.

Figure 8D:
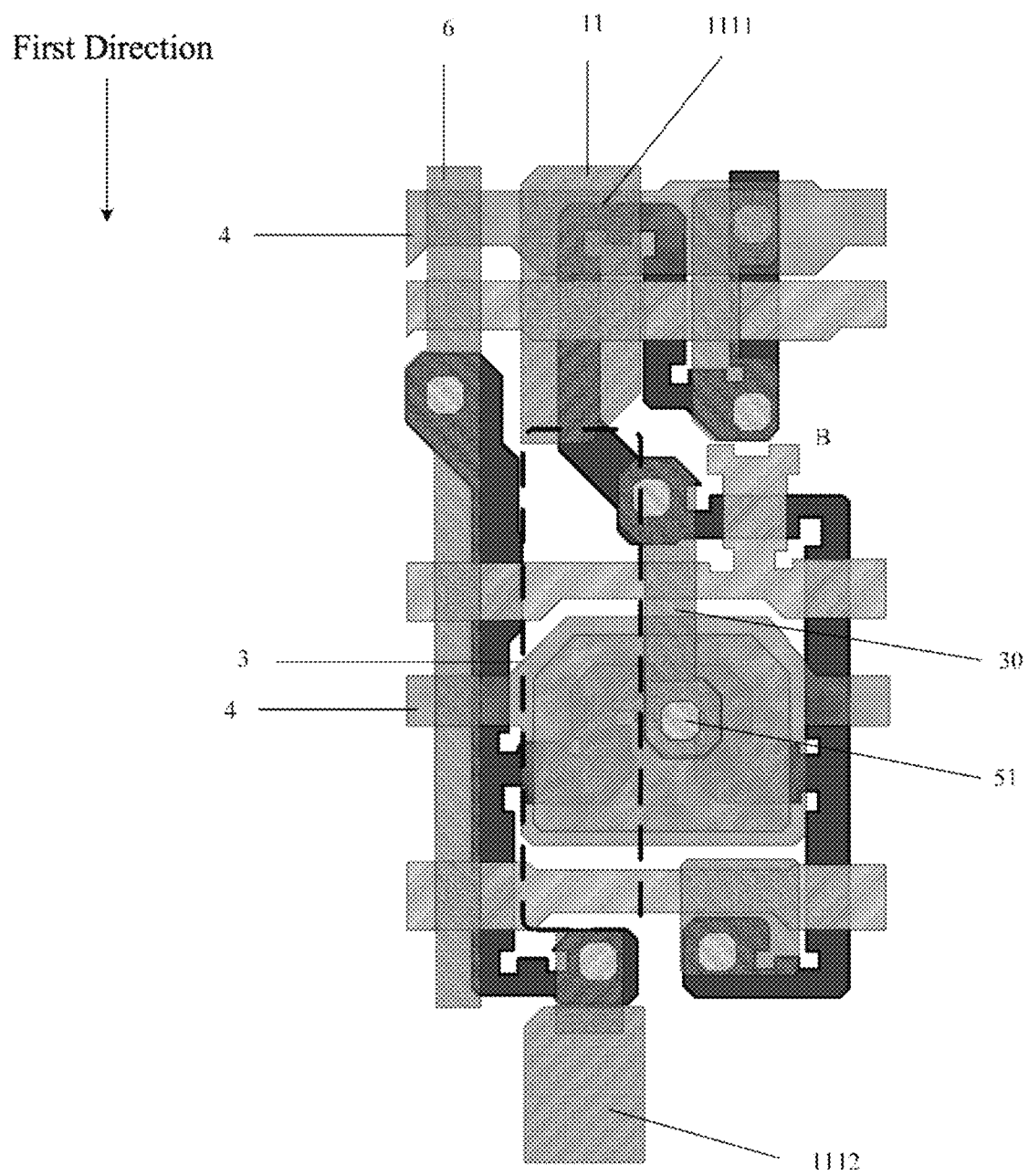

As illustrated in FIG. 8D, the manufacturing method of the array substrate further includes: forming an insulation layer (not illustrated in FIG. 8D, refer to the insulation layer 5 in FIG. 4), in which the insulation layer is between the plurality of first wires and the plurality of auxiliary wires 4 and includes first via holes 50. The plurality of auxiliary wires 4 are respectively electrically connected to the plurality portions of the first sub-wire through the first via holes 50. The manufacturing method of the array substrate further includes: forming a plurality of via holes exposing the active layer 9 for electrically connecting the source/drain electrodes to the active layer 9 through the plurality of via holes. For example, the manufacturing method of the array substrate further includes forming a second via 51 penetrating the insulation layer 5, the second electrode plate 82 of the storage capacitor, and a dielectric layer 83. For example, a data connection line 30 is formed while the plurality of auxiliary wires 4 are formed by performing the one patterning process on the first metal layer. The data connection line 30 is electrically connected to the first electrode plate 81 of the storage capacitor through the second via hole 51; and one terminal, away from the first electrode plate 81, of the data connection line 30 is connected to the source electrode or the drain electrode of the transistor of the pixel circuit.

As illustrated in FIG. 8D, the manufacturing method of the array substrate further comprises forming the plurality of first wires; the plurality of first wires comprise a first sub-wire 11 and a second sub-wire (not illustrated in FIG. 8D, referring to the second sub-wire 12 in the previous figure); the plurality of first wires are configured to provide a power signal to the light emitting element. In the method, each first sub-wire 11 extends along the first direction and includes a plurality of portions, the plurality of portions are arranged in the first direction and two adjacent portions 1111, 1112 of the plurality of portions are spaced apart by an opening 3 which is located in the light emitting region. The second sub-wire extends continuously in the first direction, that is, the second sub-wire extends along the first direction and does not include the opening. The plurality of auxiliary wires 4 intersect and are electrically connected with the plurality portions of the first sub-wires 11.

Figure 8E:
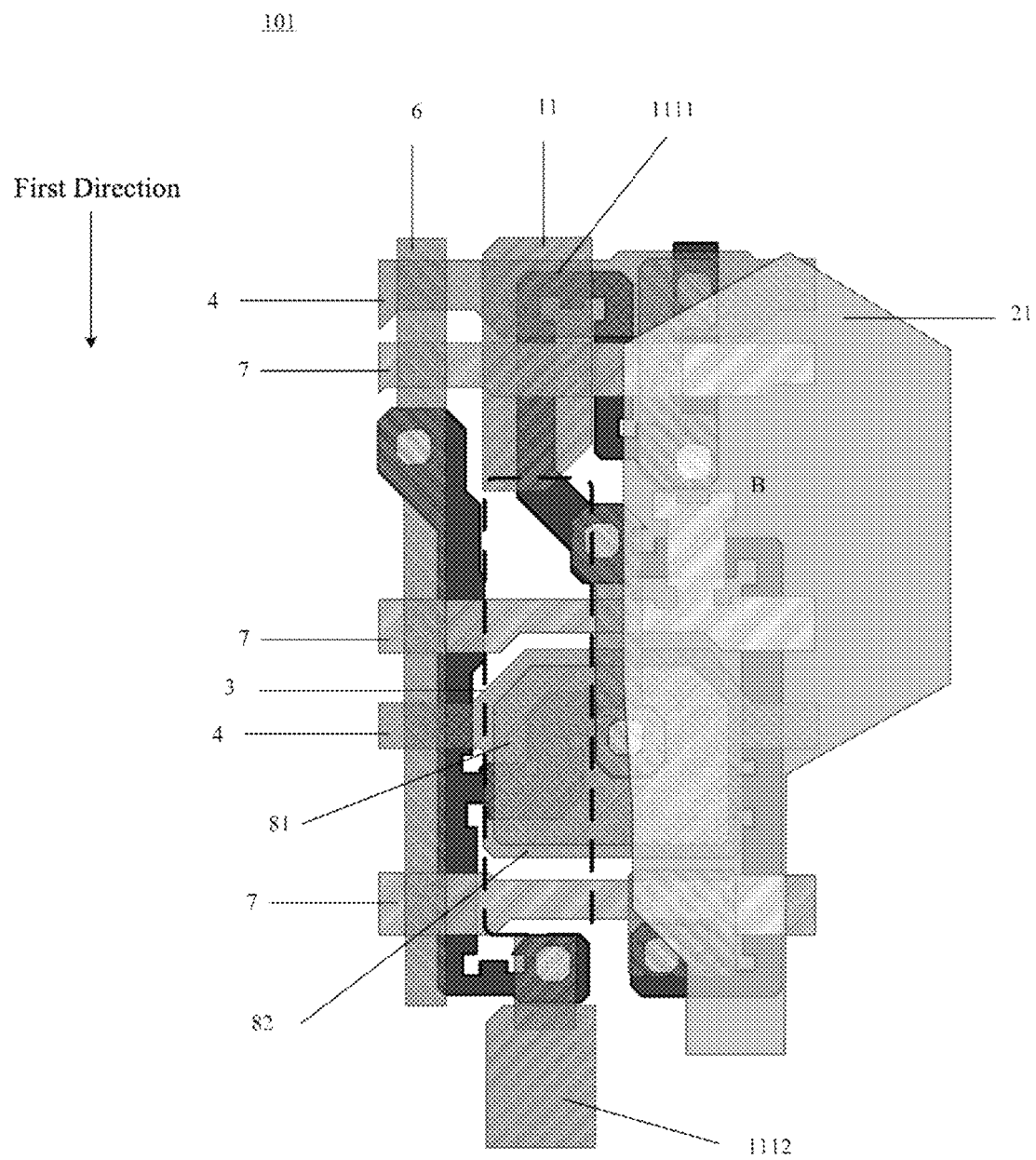

For example, as illustrated in FIG. 8E, the array substrate includes a data line 6. The data line 6 is configured to provide a data signal for controlling the light emitting state of the light emitting layer to the light emitting element if the power signal is applied to the light emitting element. For example, the manufacturing method of the array substrate further includes: forming a second metal layer, and performing one patterning process on the second metal layer to form the data line 6 and the plurality of first wires 1. That is, the data line 6 and the first wires 1 are formed by performing only one patterning process on the same layer, thereby simplifying the manufacturing process of the array substrate.

As illustrated in FIG. 8E, a light emitting layer (not illustrated) of the light emitting element and a first electrode 21 are formed. The first electrode 21 is stacked with the first wires 1 in the direction perpendicular to the array substrate, and the opening 3 does not overlap with the first electrode 21 in the direction perpendicular to the array substrate, that is, an entire orthographic projection of the opening 3 on the base substrate does not overlap with an orthographic projection of the first electrode 21 on the base substrate. In other sub-pixels, for example, a part of the opening does not overlap with the first electrode 21 in the direction perpendicular to the array substrate (i.e., the direction perpendicular to the base substrate), that is, a part of the orthographic projection of the opening on the base substrate does not overlap with the orthographic projection of the first electrode 21 on the base substrate. The planar shape of the first electrode 21 is not limited to the case illustrated in FIG. 8E. For example, the planar shape of the first electrode 21 is a regular pattern, such as rectangular pattern, circular pattern, etc., or an irregular pattern, and may be designed according to actual needs. The position and the size of the opening 3 may be designed according to the position and the planar shape of the first electrode 21.

What have been described above are only specific implementations of the present disclosure, the protection scope of the present disclosure is not limited thereto. The protection scope of the present disclosure should be based on the protection scope of the claims.

What is claimed is:

1. An array substrate, comprising:
   a plurality of pixel units in an array, wherein each of the plurality of pixel units comprises a plurality of sub-pixel units, and each of the plurality of sub-pixel units comprises a light emitting region and a non-light emitting region;
   a light emitting element, wherein each of the plurality of sub-pixel units comprises the light emitting element, the light emitting element comprises a light emitting layer and a first electrode electrically connected to the light emitting layer, and at least a part of the first electrode is in the light emitting region; and
   a plurality of first wires which are configured to supply a power signal to the light emitting element and comprise a first sub-wire, wherein the first sub-wire extends along a first direction and comprises a plurality of portions, the plurality of portions are arranged in the first direction, adjacent two portions of the plurality of portions are disconnected and spaced apart from each other by so that the first sub-wire has an opening provided between the adjacent two portions of the plurality of portions is in the light emitting region,
   wherein the first electrode of the light emitting element is stacked with the plurality of first wires in a direction perpendicular to the array substrate, and at least a part of an orthographic projection of the opening on the array substrate does not overlap with an orthographic projection of the first electrode on the array substrate;
   areas of the first electrodes of the plurality of sub-pixel units in each of the plurality of pixel units are different, the plurality of sub-pixel units in each of the plurality of pixel units comprise a first sub-pixel unit, and an area of the first electrode of the first sub-pixel unit is smallest among the first electrodes of the plurality of sub-pixel units in each of the plurality of pixel units;
   the opening is not in the light emitting region of the first sub-pixel unit, and the opening is in the light emitting regions of other sub-pixel units except the first sub-pixel unit.

2. The array substrate according to claim 1, further comprising: a plurality of auxiliary wires, extending along a second direction intersecting the first direction, wherein the plurality of first wires further comprise a second sub-wire continuously extending along the first direction; and
   the plurality of portions of the first sub-wire are respectively electrically connected to the second sub-wire through the plurality of auxiliary wires.

3. The array substrate according to claim 2, wherein the plurality of first wires comprise a plurality of the second sub-wires, and at least one of the plurality of portions of the first sub-wire is electrically connected to one second sub-wire, which is closest to the at least one of the plurality of portions of the first sub-wire, of the plurality of second sub-wires through at least one of the plurality of auxiliary wires.

4. The array substrate of claim 2, wherein at least one of the plurality of portions of the first sub-wire is electrically connected to the second sub-wire through at least two auxiliary wires of the plurality of auxiliary wires.

5. The array substrate of claim 2, wherein
   the plurality of auxiliary wires have first intersections points respectively with the plurality of portions of the first sub-wire, and the plurality of auxiliary wires are respectively electrically connected to the plurality of portions of the first sub-wire at the first intersections points;
   the plurality of auxiliary wires respectively have second intersection points with the second sub-wire, and the plurality of auxiliary wires are respectively electrically connected to the second sub-wire at the second intersection points.

6. The array substrate according to claim 5, further comprising: an insulation layer which is between the plurality of first wires and the plurality of auxiliary wires and comprises a plurality of first via holes, wherein
   a part of the plurality of first via holes are at the first intersection points, and the plurality of auxiliary wires are respectively electrically connected to the plurality of portions of the first sub-wire through the part of the plurality of first via holes; and
   another part of the plurality of first via holes are at the second intersection points, and the plurality of auxiliary wires are respectively electrically connected to the second sub-wire through the another part of the first via holes.

7. The array substrate according to claim 1, wherein the first electrode of the light emitting element is an anode, and the plurality of first wires and the first electrode of the light emitting element all are opaque.

8. The array substrate according to claim 1, wherein a material of the plurality of first wires and a material of the first electrode of the light emitting element both are a metal material.

9. The array substrate according to claim 1, further comprising:
   a data line configured to provide a data signal for controlling a light emitting state of the light emitting layer to the light emitting element if the power signal is applied to the light emitting element, wherein the data line is in a same layer as the first wires and comprises a same material as the first wires.

10. The array substrate according to claim 2, further comprising a pixel circuit, wherein the pixel circuit comprises:
    a transistor comprising an active layer, a gate electrode, a source electrode and a drain electrode; and a storage capacitor comprising a first electrode plate and a second electrode plate which are opposite to each other, wherein the gate electrode of the transistor is in a same layer as the first electrode plate of the storage capacitor and comprises a same material as the first electrode plate of the storage capacitor, and the plurality of auxiliary wires are in a same layer as the second electrode plate of the storage capacitor and comprise a same material as the second electrode plate of the storage capacitor.

11. A display panel comprising the array substrate according to claim 1.

12. The display panel according to claim 11, further comprising a fingerprint recognition device and a fingerprint recognition region, wherein the fingerprint recognition device is provided on the array substrate and in the fingerprint recognition region; and at least a part of the orthographic projection of the opening on the array substrate is in the fingerprint recognition region.

13. The display panel according to claim 12, further comprising a non-fingerprint recognition region except the fingerprint recognition region, wherein no part of the orthographic projection of the opening on the array substrate is in the non-fingerprint recognition region.

14. An array substrate, comprising:
a plurality of pixel units in an array, wherein each of the plurality of pixel units comprises a plurality of sub-pixel units, and each of the plurality of sub-pixel units comprises a light emitting region and a non-light emitting region;
a light emitting element, wherein each of the plurality of sub-pixel units comprises the light emitting element, the light emitting element comprises a light emitting layer and a first electrode electrically connected to the light emitting layer, and at least a part of the first electrode is in the light emitting region; and
a plurality of first wires which are configured to supply a power signal to the light emitting element and comprise a first sub-wire, wherein the first sub-wire extends along a first direction and comprises a plurality of portions, the plurality of portions are arranged in the first direction, adjacent two portions of the plurality of portions are disconnected and spaced apart from each other so that the first sub-wire has an opening provided between the adjacent two portions of the plurality of portions, and the opening is in the light emitting region,
wherein the first electrode of the light emitting element is stacked with the plurality of first wires in a direction perpendicular to the array substrate, and at least a part of an orthographic projection of the opening on the array substrate does not overlap with an orthographic projection of the first electrode on the array substrate;
each of the plurality of pixel units comprises a red sub-pixel unit emitting red light, a green sub-pixel unit emitting green light, and a blue sub-pixel unit emitting blue light;
the opening is in the light emitting region of the blue sub-pixel unit and is in the light emitting region of the red sub-pixel units, and the opening is not in the light emitting region of the green sub-pixel unit.

15. A manufacturing method of an array substrate, wherein
the array substrate comprises a plurality of pixel units in an array, each of the plurality of pixel units comprises a plurality of sub-pixel units, and each of the plurality of sub-pixel units comprises a light emitting region and a non-light emitting region;

the manufacturing method comprises:
forming a light emitting element in each of the plurality of sub-pixel units, wherein the light emitting element comprises a light emitting layer and a first electrode electrically connected to the light emitting layer, and at least a part of the first electrode is in the light emitting region; and
forming a plurality of first wires, wherein the plurality of first wires are configured to supply a power signal to the light emitting element, the plurality of first wires comprise a first sub-wire; the first sub-wire extends along a first direction and comprises a plurality of portions, the plurality of portions are arranged in the first direction, adjacent two portions of the plurality of portions are disconnected and spaced apart from each other so that the first sub-wire has an opening provided between the adjacent two portions of the plurality of portions, and the opening is in the light emitting region;
the first electrode of the light emitting element is stacked with the plurality of first wires in a direction perpendicular to the array substrate, and at least a part of an orthographic projection of the opening on the array substrate does not overlap with an orthographic projection of the first electrode on the array substrate;
areas of the first electrodes of the plurality of sub-pixel units in each of the plurality of pixel units are different, the plurality of sub-pixel units in each of the plurality of pixel units comprise a first sub-pixel unit, and an area of the first electrode of the first sub-pixel unit is smallest among the first electrodes of the plurality of sub-pixel units in each of the plurality of pixel units;
the opening is not in the light emitting region of the first sub-pixel unit, and the opening is in the light emitting regions of other sub-pixel units except the first sub-pixel unit.

16. The manufacturing method of the array substrate according to claim 15, further comprising:
forming a plurality of auxiliary wires, wherein the plurality of auxiliary wires extend along a second direction intersecting the first direction;
the forming the plurality of first wires further comprise:
forming a second sub-wire, wherein the second sub-wire continuously extends along the first direction; and
wherein the plurality of portions of the first sub-wire are respectively electrically connected to the second sub-wire through the plurality of auxiliary wires.

17. The manufacturing method of the array substrate according to claim 15, further comprising: forming a transistor and a storage capacitor, wherein
the forming the transistor and the storage capacitor comprises:
forming a gate metal layer; and
performing one patterning process on the gate metal layer to form a gate electrode of the transistor and a first electrode plate of the storage capacitor.

18. The manufacturing method of the array substrate according to claim 16, further comprising:
forming a first metal layer; and
performing one patterning process on the first metal layer to form the plurality of auxiliary wires and a second electrode plate of the storage capacitor, wherein the second electrode plate of the storage capacitor and at least one auxiliary wire of the auxiliary wires are integral with each other.

19. The manufacturing method of the array substrate according to claim 15, wherein the array substrate comprises a data line, the data line is configured to provide a data signal for controlling a light emitting state of the light emitting layer to the light emitting element if the power signal is applied to the light emitting element, and the manufacturing method comprises:

forming a second metal layer; and performing one patterning process on the second metal layer to form the data line and the plurality of first wires.

* * * * *